United States Patent
Zhan et al.

(10) Patent No.: US 12,062,672 B2
(45) Date of Patent: *Aug. 13, 2024

(54) DETECTION SUBSTRATE, PREPARATION METHOD THEREOF AND FLAT PANEL DETECTOR

(71) Applicants: Beijing BOE Sensor Technology Co., Ltd., Beijing (CN); BOE Technology Group Co., Ltd., Beijing (CN)

(72) Inventors: Xiangmi Zhan, Beijing (CN); Xuecheng Hou, Beijing (CN); Zhi Ding, Beijing (CN); Guan Zhang, Beijing (CN); Jianxing Shang, Beijing (CN); Jingjie Su, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,069

(22) Filed: May 22, 2023

(65) Prior Publication Data
US 2023/0299101 A1    Sep. 21, 2023

Related U.S. Application Data

(63) Continuation of application No. 16/975,830, filed as application No. PCT/CN2019/111071 on Oct. 14, 2019, now Pat. No. 11,876,106.

(51) Int. Cl.
*H01L 27/146* (2006.01)
(52) U.S. Cl.
CPC .. *H01L 27/14612* (2013.01); *H01L 27/14663* (2013.01); *H01L 27/14692* (2013.01)

(58) Field of Classification Search
CPC ......... H01L 27/14612; H01L 27/14663; H01L 27/14692; H01L 27/14603
See application file for complete search history.

(56) References Cited

U.S. PATENT DOCUMENTS

| 9,735,195 B2 | 8/2017 | Shu et al. |
| 10,096,642 B2 | 10/2018 | Ishino |

(Continued)

FOREIGN PATENT DOCUMENTS

| CN | 104637970 A | 5/2015 |
| CN | 104716152 A | 6/2015 |

(Continued)

OTHER PUBLICATIONS

US 11,830,896 B2, 11/2023, Zhan (withdrawn)*
(Continued)

*Primary Examiner* — Seung C Sohn
(74) *Attorney, Agent, or Firm* — ArentFox Schiff LLP; Michael Fainberg

(57) ABSTRACT

The embodiments of the present disclosure provide a detection substrate, a preparation method thereof and a flat panel detector. An orthographic projection of a first electrode on the base substrate is set to be at least partially overlapped with an orthographic projection of an active layer of a thin film transistor on the base substrate, a first protruding part is arranged on a side, close to a corresponding data line, of the first electrode, an orthographic projection of the first protruding part on the base substrate is located between the orthographic projection of the active layer on the base substrate and an orthographic projection of the data line on the base substrate.

20 Claims, 29 Drawing Sheets

(56) References Cited

U.S. PATENT DOCUMENTS

| | | |
|---|---|---|
| 10,468,450 B2 | 11/2019 | Karim |
| 11,355,534 B2 * | 6/2022 | Hou .................. H01L 27/14692 |
| 11,876,106 B2 * | 1/2024 | Zhan ................. H01L 27/14692 |
| 2009/0218646 A1 | 9/2009 | Okada |
| 2010/0163882 A1 | 7/2010 | Jung |
| 2014/0103347 A1 | 4/2014 | Ishino |
| 2014/0145198 A1 | 5/2014 | Kim et al. |
| 2014/0145252 A1 | 5/2014 | Kim et al. |
| 2014/0374745 A1 | 12/2014 | Takahashi et al. |
| 2015/0287760 A1 | 10/2015 | Karim |
| 2016/0293658 A1 | 10/2016 | Gao et al. |
| 2016/0380022 A1 | 12/2016 | Shu et al. |
| 2019/0019813 A1 | 1/2019 | Ren et al. |
| 2020/0161402 A1 | 5/2020 | Wang et al. |
| 2021/0384236 A1 | 12/2021 | Hou et al. |

FOREIGN PATENT DOCUMENTS

| | | |
|---|---|---|
| CN | 107170765 A | 9/2017 |
| CN | 107359168 A | 11/2017 |
| CN | 108767016 A | 11/2018 |
| CN | 109671729 A | 4/2019 |
| JP | 2009231788 A | 10/2009 |
| JP | 2011-075327 A | 4/2011 |
| JP | 2011159782 A | 8/2011 |
| JP | 2012074625 A | 4/2012 |
| JP | 2014078651 A | 5/2014 |
| JP | 2015026828 A | 2/2015 |
| JP | 2018513346 A | 5/2018 |
| WO | 2019076130 A1 | 4/2019 |

OTHER PUBLICATIONS

European Search Report for 19945392.9 issued on Nov. 9, 2022.
OA issued in Chinese application 201980001960.0 on Apr. 28, 2023.
Notice of Allowance for U.S. Appl. No. 16/975,830 issued on Mar. 8, 2023.
Office Action in EP19945392.9, mailed Dec. 11, 2023, 4 pages.
Office Action in JP2021568343, mailed Nov. 28, 2023, 5 pages.
Notice of Allowance received for Japanese Patent Application No. 2021-568343, mailed on May 21, 2024, 6 pages (3 pages of English Translation and 3 pages of Original Document).

* cited by examiner

DETECTION SUBSTRATE, PREPARATION METHOD THEREOF AND FLAT PANEL DETECTOR

This disclosure is a continuation of U.S. patent application Ser. No. 16/975,830, filed on Aug. 26, 2020, which is a US National Stage of International Application No. PCT/CN2019/111071, filed Oct. 14, 2019, the content of which is hereby incorporated by reference in its entirety.

FIELD

The present disclosure relates to the field of photoelectric detection technology, in particular to a detection substrate, a preparation method thereof and a flat panel detector.

BACKGROUND

The X-ray detection technology is widely used in such fields as industrial nondestructive testing, container scanning, circuit board inspection, medical treatment, security, and industry, with a broad application prospect.

Traditional X-ray imaging technology belongs to analog signal imaging, with a low resolution and a poor imaging quality. The X-ray digital radio graphy (DR) emerged in the late 1990s adopts an X-ray flat panel detector to directly convert an X image into a digital image, and has become a research hotspot nowadays since the converted digital image is clear, high in resolution, and easy to store and transmit.

According to a difference in structures, the X-ray flat panel detector is divided into a direct DR X-ray flat panel detector and an indirect DR X-ray flat panel detector. Wherein the indirect DR X-ray flat panel detector is widely developed and applied owing to its mature technology, relatively low cost, high detective quantum efficiency (DQE), good reliability and other advantages.

The X-ray flat panel detector mainly includes a thin film transistor (TFT) and a photodiode (PIN). Under the irradiation of an X-ray, a scintillation layer or a fluorescence layer of the indirect DR X-ray flat panel detector converts X-ray photons into visible light, then converts the visible light into electrical signals under the effect of the PIN, and finally reads the electrical signals through the TFT and outputs the electrical signal to obtain a display image.

SUMMARY

An embodiment of the present disclosure provides a detection substrate, including: a base substrate; a plurality of data lines extending along a first direction; a plurality of gate lines extending along a second direction; a plurality of thin film transistors arranged on the base substrate; a plurality of first electrodes, a plurality of photoelectric conversion structures and a plurality of second electrodes arranged in sequence in a laminated manner and electrically connected with each other; and a plurality of bias lines electrically connected with the plurality of second electrodes.

Each first electrode is electrically connected with a corresponding thin film transistor, and an orthographic projection of the each first electrode on the base substrate at least partially overlaps with an orthographic projection of an active layer of the corresponding thin film transistor on the base substrate.

The each first electrode includes a first protruding part arranged on a side, close to a corresponding data line, of the each first electrode, and an orthographic projection of the first protruding part on the base substrate is located between the orthographic projection of the active layer on the base substrate and an orthographic projection of the corresponding data line on the base substrate.

Optionally, in the above detection substrate provided in an embodiment of the present disclosure, each data line includes a first groove arranged on a side, close to the first protruding part, of the each data line, and a distance between the each first electrode and the corresponding data line along the second direction is basically equal.

Optionally, the above detection substrate provided in an embodiment of the present disclosure further includes an insulating layer arranged between the thin film transistor and the first electrode, wherein the each first electrode is electrically connected with the corresponding thin film transistor through a via hole on the insulating layer; and the each first electrode includes a second protruding part arranged on a side, close to a corresponding gate line, of the each first electrode, and the second protruding part covers the via hole.

Optionally, in the above detection substrate provided in an embodiment of the present disclosure, each gate line includes a second groove arranged on a side, close to the second protruding part, of the each gate line, and a distance between the each first electrode and the corresponding gate line along the first direction is basically equal.

Optionally, in the above detection substrate provided in an embodiment of the present disclosure, the insulating layer includes a first passivation layer, a second passivation layer and a third passivation layer which are arranged in sequence in the laminated manner, wherein the first passivation layer and the third passivation layer both include at least one of silicon oxide and silicon oxynitride.

Optionally, in the above detection substrate provided in an embodiment of the present disclosure, the second passivation layer is of a resin material, and a thickness of the second passivation layer ranges from 1 μm to 3 μm.

Optionally, in the above detection substrate provided in an embodiment of the present disclosure, an orthographic projection of the photoelectric conversion structure on the base substrate at least partially surrounds an orthographic projection of the via hole on the base substrate.

Optionally, in the above detection substrate provided in an embodiment of the present disclosure, an orthographic projection of the photoelectric conversion structure on the base substrate covers an orthographic projection of the via hole on the base substrate and the orthographic projection of the active layer on the base substrate.

Optionally, in the above detection substrate provided in an embodiment of the present disclosure, an orthographic projection of the bias line on the base substrate is not overlapped with the orthographic projection of the active layer on the base substrate.

Optionally, in the above detection substrate provided in an embodiment of the present disclosure, a material of the active layer is metal oxide.

Optionally, the above detection substrate provided in an embodiment of the present disclosure further includes: a transparent lead layer arranged in a bonding area; and the data line extends to the bonding area, and the data line has a corresponding electrically connected first outgoing line in the layer in which the first electrode is located, the layer in which the bias line is located and the transparent lead layer which are above the bonding area.

Optionally, in the above detection substrate provided in an embodiment of the present disclosure, the gate line extends to the bonding area, and the gate line has a corresponding electrically connected second outgoing line in the layer in which the data line is located, the layer in which the first electrode is located, the layer in which the bias line is located and the transparent lead layer which are above the bonding area.

An embodiment of the present disclosure further provides a flat panel detector, including the above detection substrate provided in an embodiment of the present disclosure.

An embodiment of the present disclosure further provides a method for preparing the above detection substrate, including: providing a base substrate; and forming one or more film layers of the thin film transistor, an insulating layer with a via hole, the plurality of first electrodes, the plurality of photoelectric conversion structures, the plurality of second electrodes and the plurality of bias lines in sequence on the base substrate, wherein the each first electrode is electrically connected with the corresponding thin film transistor through the via hole, and the plurality of bias lines are electrically connected with the plurality of second electrodes.

Optionally, in the above method provided in an embodiment of the present disclosure, the forming the insulating layer with the via hole further includes: in a first manufacturing facility: forming the first passivation layer; forming a first via hole corresponding to a position of the thin film transistor on the first passivation layer; and forming the second passivation layer and the third passivation layer; in a second manufacturing facility: respectively forming a second via hole and a third via hole corresponding to the first via hole on the second passivation layer and the third passivation layer.

Optionally, in the above method provided in an embodiment of the present disclosure, the forming the insulating layer with the via hole further includes: in a first manufacturing facility: forming a first passivation layer and a second passivation layer in sequence; exposing the second passivation layer, and forming a second via hole penetrating through the second passivation layer and corresponding to a position of the thin film transistor; forming a first via hole corresponding to the second via hole on the first passivation layer; and forming a third passivation layer on the second passivation layer; in a second manufacturing facility: forming a third via hole corresponding to the second via hole on the third passivation layer.

DETAILED DESCRIPTION OF THE EMBODIMENTS

Figure 1:
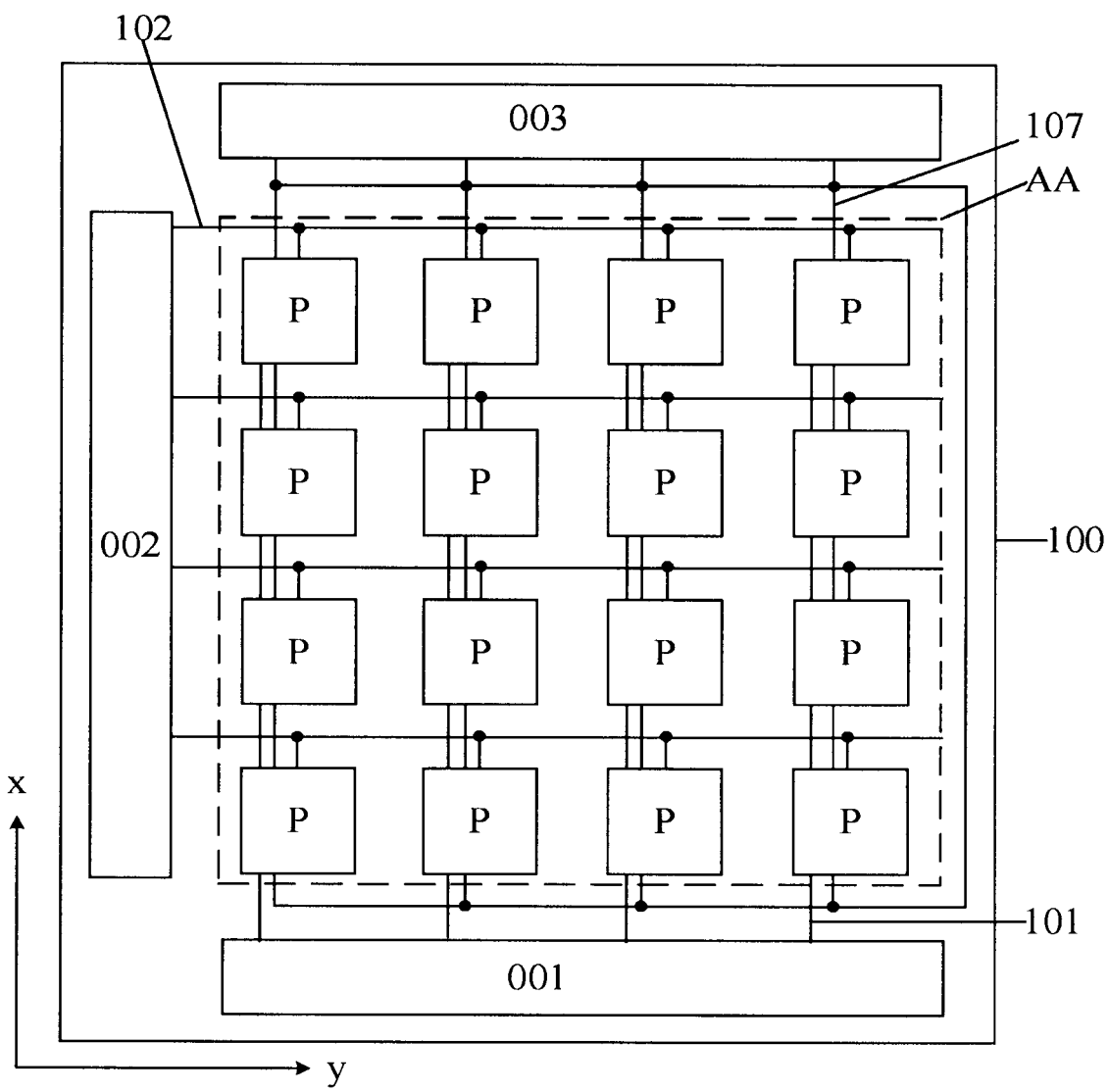
FIG. 1 is top-view structural schematic diagram of a detection substrate provided in an embodiment of the present disclosure.

In order to make the objectives, technical solutions, and advantages of the embodiments of the present disclosure clearer, a clear and complete description will be given below on the technical solutions in the embodiments of the present disclosure in combination with accompanying drawings in the embodiments of the present disclosure. Apparently, the described embodiments are only a part but not all of the embodiments of the present disclosure. Based upon the embodiments of the present disclosure, all of the other embodiments obtained by those skilled in the art without any creative effort shall all fall within the protection scope of the present disclosure.

Unless otherwise defined, the technical or scientific terms used in the present disclosure shall have a general meaning understood by those skilled in the art to which the present disclosure belongs. The terms "first", "second" and the like used in the description and claims of the present disclosure do not indicate any order, quantity, or importance, but are merely intended to distinguish different components. Words like "include" or "including" mean that the element or object preceding the word covers the element or object listed after the word and its equivalent, without excluding other elements or objects. Terms like "inner", "outer", "upper" and "lower" are merely intended to represent the relative position relationship, and when the absolute position of the described object changes, the relative positional relationship may also change correspondingly.

In the related art, a TFT contained in a flat panel detector can be an amorphous silicon (a-Si) TFT, however, the a-Si TFT has the shortcomings of low mobility ratio and large intrinsic size, leading to low frame rate and low pixel fill rate of such type of flat panel detector.

The oxide TFT represented by an amorphous indium gallium zinc oxide (a-IGZO) TFT has excellent performances of high mobility ratio, high transparency, small size, low preparation temperature and low cost, such that the frame rate and pixel fill rate of the flat panel detector containing a-IGZO TFT are both high.

In a process of manufacturing a flat panel detector containing a-IGZO TFT, a passivation layer and a PIN film layer generally need to be deposited on the a-IGZO TFT. However, in the deposition process of the passivation layer and the PIN film layer, hydrogen diffuses to a channel region of the a-IGZO TFT, such that the stability of the a-IGZO TFT is relatively poor, and further the performance of the flat panel detector is influenced.

Aiming at the above problem existing in the related technology, an embodiment of the present disclosure provides a detection substrate, a preparation method thereof and a flat panel detector.

A brief description will be given below on specific embodiments of a detection substrate, a preparation method thereof and a flat panel detector provided in embodiments of the present disclosure in combination with accompanying drawings. The thickness and shape of each film layer in the accompanying drawings do not reflect the true proportion, merely aiming at schematically illustrating the content of the present disclosure.

An embodiment of the present disclosure provides a detection substrate. As shown in FIG. 1, the detection substrate includes: a base substrate 100; a source driver 001, a gate driver 002 and a bias voltage meter 003, a plurality of data lines 101 extending along a first direction x and a plurality of gate lines 102 extending along a second direction y, which are arranged on the base substrate 100; and a plurality of pixel units P arranged in a detection area AA.

Figure 2:
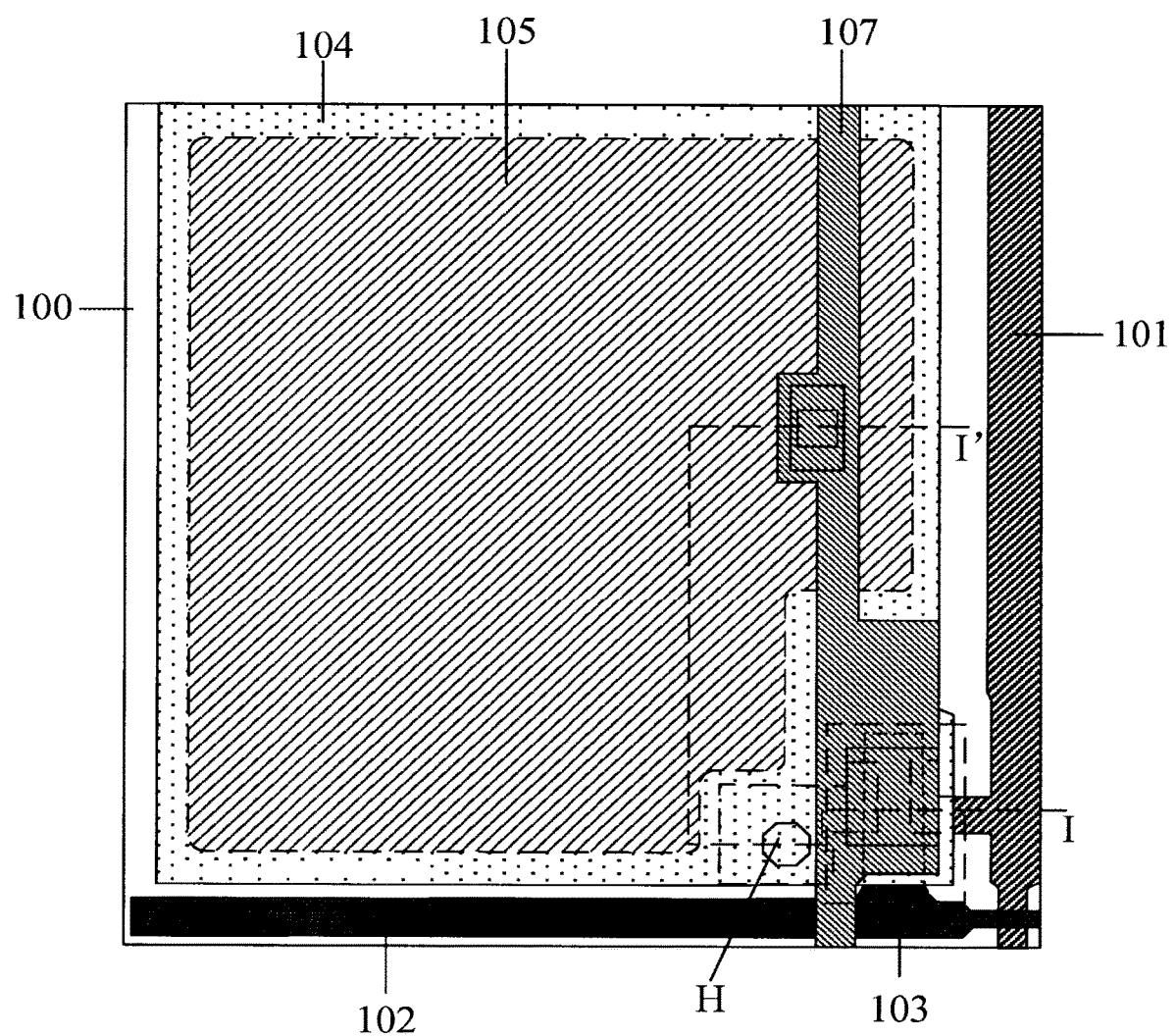
FIG. 2 is a first top-view structural schematic diagram of a pixel unit on the detection substrate as shown in FIG. 1.
Figure 3:
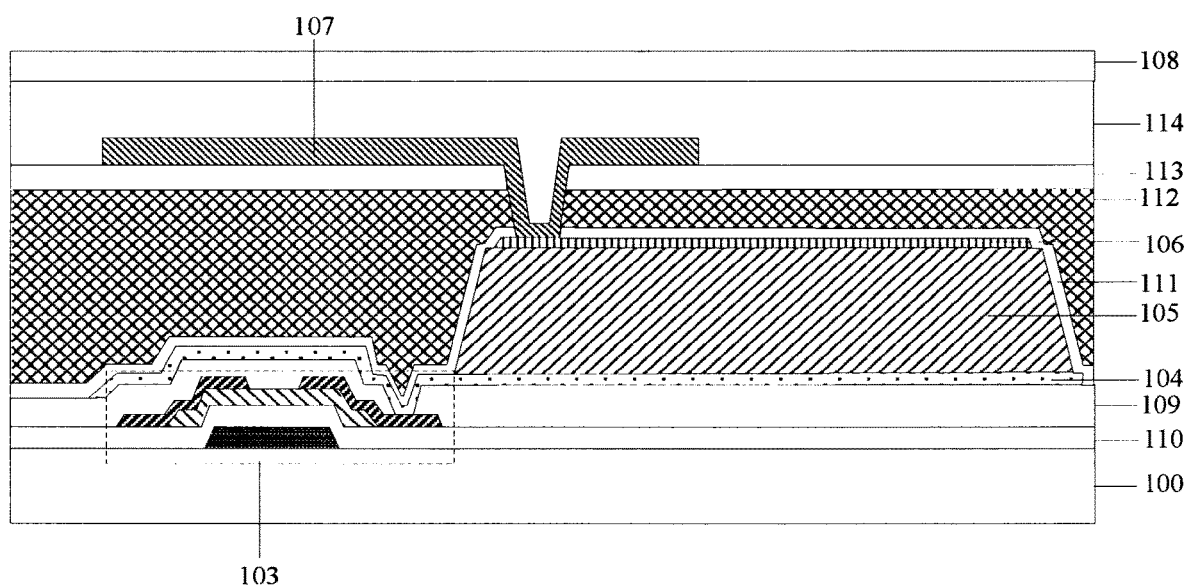
FIG. 3 is a sectional structural schematic diagram along an I-I' line in FIG. 2.

As shown in FIG. 2 and FIG. 3, each pixel unit P includes: a thin film transistor 103 arranged on the base substrate 100; a first electrode 104, a photoelectric conversion structure 105 and a second electrode 106 arranged in sequence in a laminated manner and electrically connected with each other.

The first electrode 104 is electrically connected with the thin film transistor 103, and an orthographic projection of the first electrode 104 on the base substrate 100 at least partially overlaps with an orthographic projection of an active layer of the thin film transistor 103 on the base substrate 100.

A first protruding part is arranged on the side, close to the data line 102, of the first electrode 104, and an orthographic projection of the first protruding part on the base substrate 100 is located between the orthographic projection of the active layer of the thin film transistor 103 on the base substrate 100 and the orthographic projection of the data line 101 on the base substrate 100.

The each pixel unit P further includes a plurality of bias lines 107 electrically connected with the plurality of second electrodes 106.

The source driver 001 provides a data signal for the data line 101.

The gate driver 002 provides a scanning signal for the gate line 102.

The bias voltage meter 003 provides a bias voltage signal for the bias line 107.

Optionally, the photoelectric conversion structure 105 may be a PN structure, and may also be a PIN structure. Specifically, the PIN structure includes an N-type semiconductor layer with N-type impurities, an intrinsic semiconductor layer with no impurities and a P-type semiconductor layer with P-type impurities which are arranged on the first electrode 104 in sequence in a laminated manner. The thickness of the first intrinsic semiconductor layer may be greater than the thickness of the P-type semiconductor layer and the thickness of the N-type semiconductor layer.

The photoelectric conversion structure 105 can convert optical signals into electrical signals, transmit the electrical signals to the thin film transistor 103 through a first electrode 104, and further read the electrical signals through a data line 101 and convert into image signals.

An opposite area exists between the second electrode 106 and the first electrode 104, a storage capacitor may be formed between the second electrode 106 and the first electrode 104, and electrical signals converted by the photoelectric conversion structure 105 can be stored in the above storage capacitor. Specifically, the second electrode 106 can be formed by transparent materials such as indium tin oxide (ITO) or indium zinc oxide (IZO) to improve light transmission efficiency.

In addition, the orthographic projection of the second electrode 106 on the base substrate 100 is within the orthographic projection of the photoelectric conversion structure 105 on the base substrate 100, that is, the area of the second electrode 106 is slightly smaller than the area of the photoelectric conversion structure 105. As shown in FIG. 3, the distance between the edge of the second electrode 106 and the edge of the photoelectric conversion structure 105 ranges from 1 μm to 3 μm, for example, the distance may be 1.0 μm, 1.5 μm, 1.8 μm, 2.0 μm, 2.5 μm and 3.0 μm, etc. Through the above setting, leakage current caused by damage of the PIN side wall during etching can be reduced.

Optionally, the base substrate 100 may be a flexible base substrate, for example, the base substrate 100 may be a plastic base substrate made of polyethylene ether phthalate, polyethylene naphthalate, polycarbonate, polyarylate, polyetherimide, polyether sulfone or polyimide with a favorable heat resistance and durability, and the base substrate 100 may also be a rigid substrate, such as a glass substrate, which is not defined herein.

In the above detection substrate provided in an embodiment of the present disclosure, the orthographic projection of the first electrode 104 on the base substrate 100 is set to be at least partially overlapped with the orthographic projection of the active layer of the thin film transistor 103 on the base substrate 100, a first protruding part is arranged on a side, close to the data line 101, of the first electrode 104, the orthographic projection of the first protruding part on the base substrate 100 is located between the orthographic projection of the active layer on the base substrate 100 and the orthographic projection of the data line 101 on the base substrate 100, thereby preventing hydrogen from diffusing to the channel region in the subsequent process of manufacturing the photoelectric conversion structure 105, effectively improving the stability of the thin film transistor 103, and improving the performance of the flat panel detector. In addition, the part, covering the thin film transistor 103, of the first electrode 104 can provide compensation voltage for the thin film transistor, thereby improving critical voltage of the thin film transistor element 103, and reducing leakage current.

Optionally, in the above detection substrate provided in an embodiment of the present disclosure, the thin film transistor 103 may include an active layer formed by metal oxide, such as indium gallium zinc oxide (IGZO), and the active layer may include a channel region and a source-drain contact area. The IGZO active layer has an excellent carrier mobility, thereby improving reading rate of detected data, and realizing dynamic and real-time detection.

Optionally, as shown in FIG. 3, the above detection substrate provided in an embodiment of the present disclosure further includes a scintillation layer 108, the material of the above scintillation layer 108 is a material which can convert an X-ray into visible light, for example, CsI:Tl, $Gd_2O_2S$:Tb, etc., and other possible materials may also include CsI:Na, $CaWO_4$, $CdWO_4$, NaI:Tl, $BaFCl:Eu^{2+}$, $BaSO_4:Eu^{2+}$, $BaFBr:Eu^{2+}$, $LaOBr:Tb^{3+}$, $LaOBr:Tm^{3+}$, $La2O2S:Tb^{3+}$, $YTaO_4$, $YTaO_4$:Nb, ZnS:Ag, $ZnSiO_4:Mn^{2+}$, $LiI:Eu^{2+}$, $CeF_3$, etc.

The wavelength peak of the visible light converted by the incident X-ray on the scintillation crystal contained in the scintillation layer 108 ranges from 530 nm to 580 nm, and the spectral range can reach 350 nm to 700 nm. The light has a very short delay effect, and can attenuate to less than 1% of the X-ray irradiation brightness within 1 ms after the disappearance of the X-ray.

Optionally, as shown in FIG. 2 and FIG. 3, in the above detection substrate provided in an embodiment of the present disclosure, the orthographic projection of the first electrode 104 on the base substrate 100 covers the orthographic projection of the active layer of the thin film transistor 103 on the base substrate 100, that is, the first electrode 104 covers the channel region A, and the source-drain contact area at two sides of the channel region A. The part, covering the active layer, of the first electrode 104 can effectively avoid influence of external light on the channel region, and improve the signal to noise ratio.

Optionally, as shown in FIG. 2, in the above detection substrate provided in an embodiment of the present disclosure, the width of the first protruding part on the second direction y ranges from 2 μm to 4 μm. The width of the first protruding part of the first electrode 104 is set to be 2 μm to 4 μm, thereby effectively avoiding the influence of external light on the channel region, and improving the signal to noise ratio.

Optionally, as shown in FIG. 2, in the above detection substrate provided in an embodiment of the present disclosure, a first groove is arranged on a side, close to the first protruding part, of the data line 101, to ensure that the distance between the first electrode 104 and the data line along the second direction y is basically equal, and reduce crosstalk between the signal of the data line 101 and the signal of the first electrode 104; moreover, the part not having a groove on the data line 101 ensures that the resistance of the data line 101 satisfies requirements, that is, the resistance of the data line 101 will not be too large due to the setting of the first groove.

Figure 4:
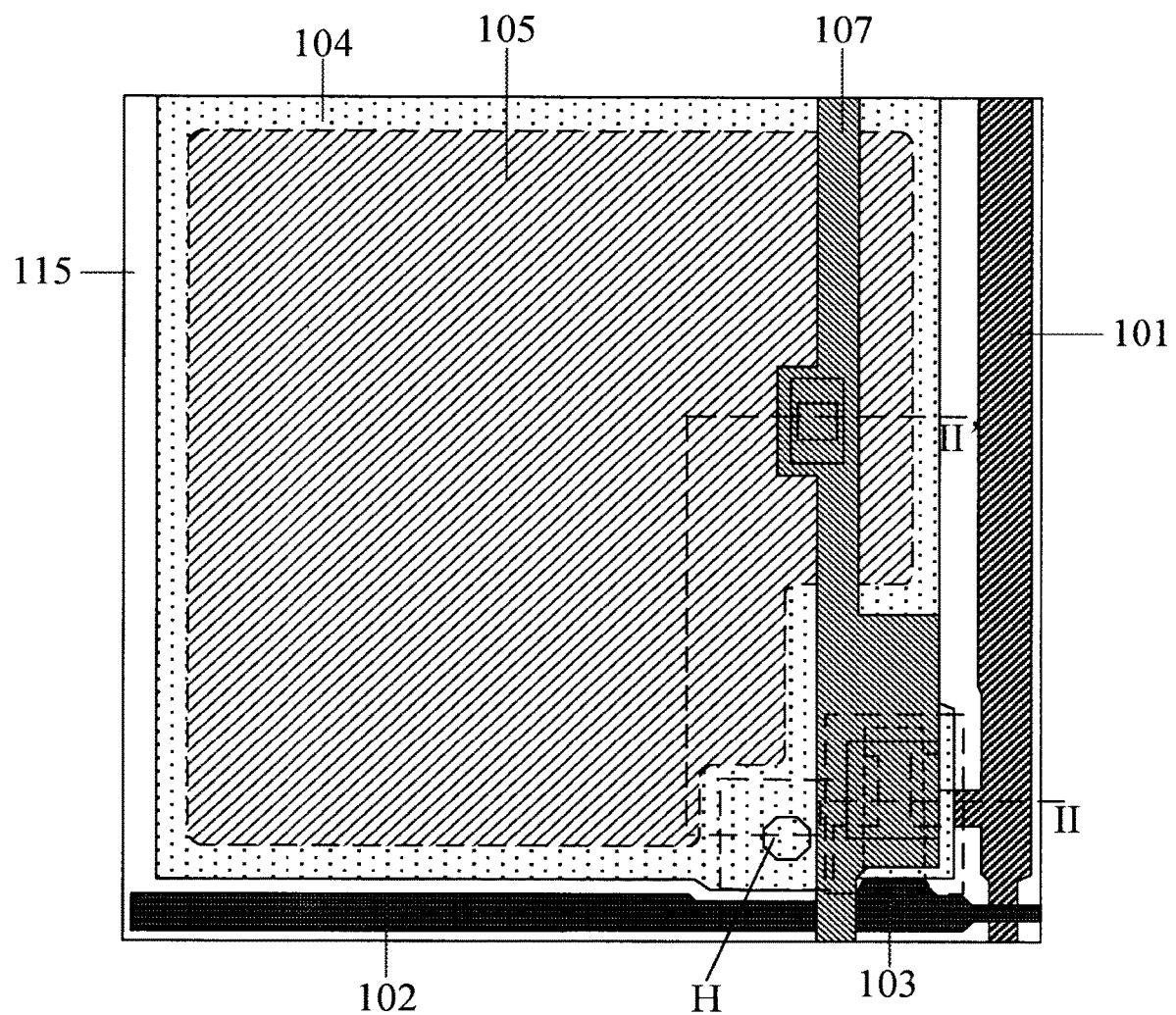
FIG. 4 is a second top-view structural schematic diagram of a pixel unit on the detection substrate as shown in FIG. 1.
Figure 5:
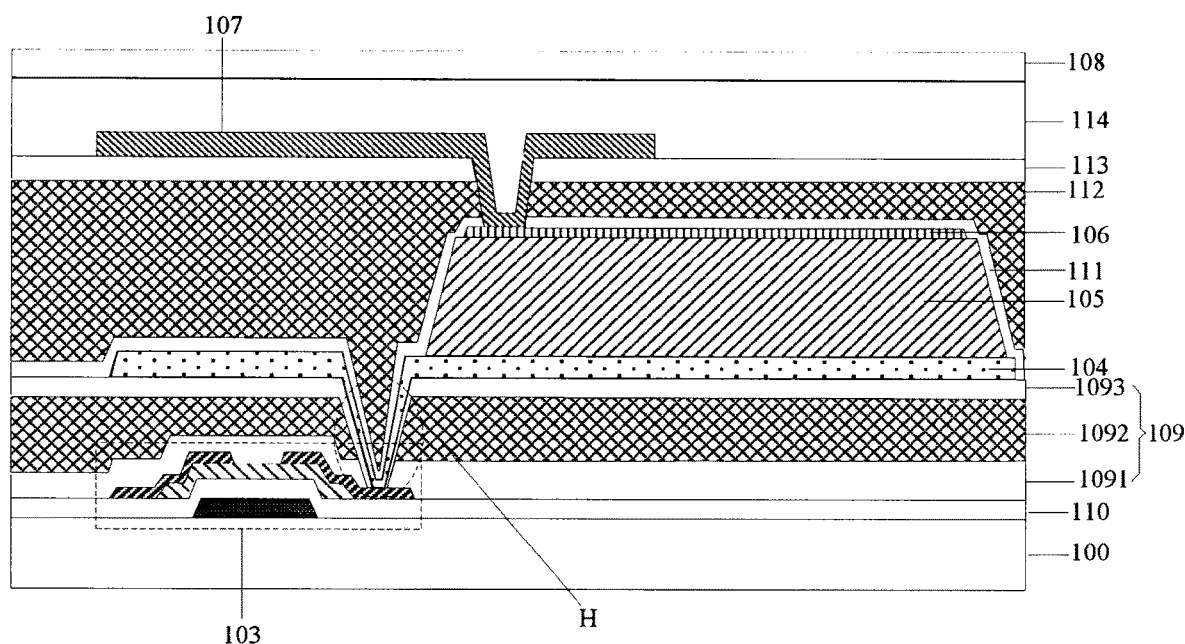
FIG. 5 is a sectional structural schematic diagram along an II-II' line in FIG. 4.
Figure 6:
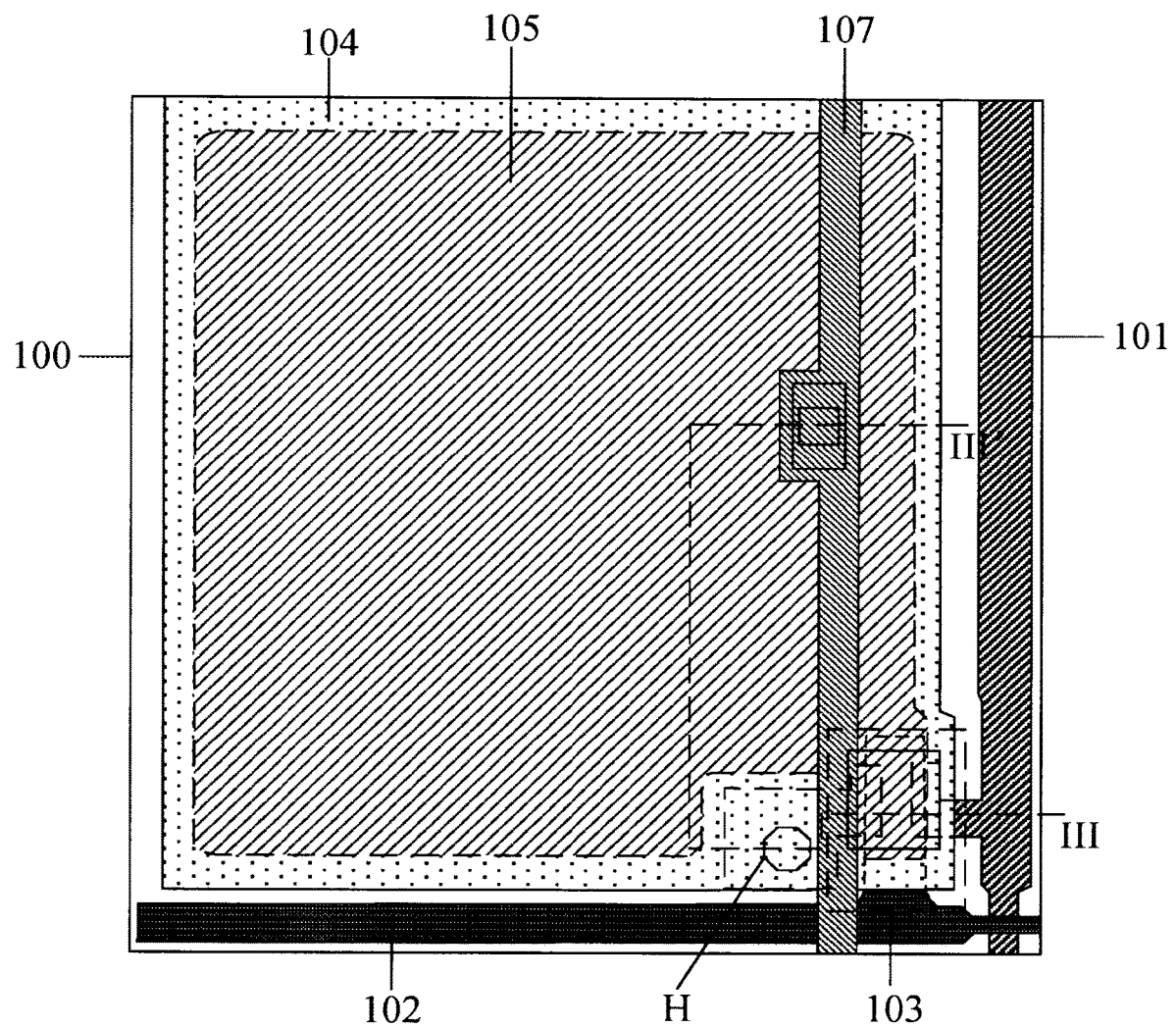
FIG. 6 is a third top-view structural schematic diagram of a pixel unit on the detection substrate as shown in FIG. 1.
Figure 7:
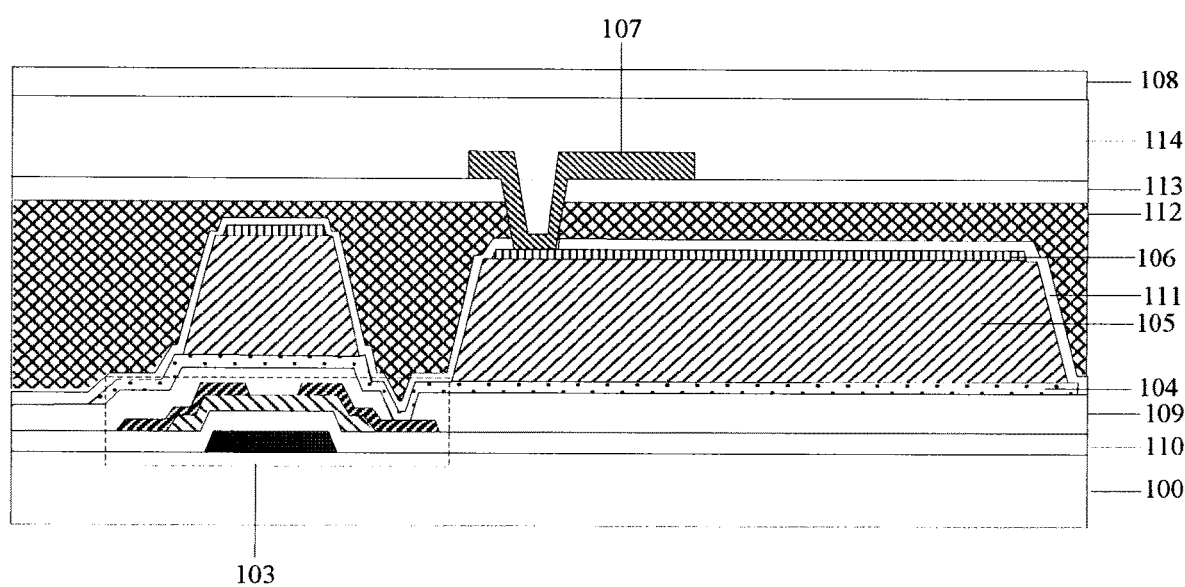
FIG. 7 is a sectional structural schematic diagram along an III-III' line in FIG. 6.

Optionally, as shown in FIG. 4 and FIG. 5, the above detection substrate provided in an embodiment of the present disclosure further includes an insulating layer 109 arranged between the thin film transistor 103 and the first electrode 104, wherein the first electrode 104 is electrically connected with the thin film transistor 103 through a via hole H on the insulating layer 109; and a second protruding part is arranged on the side, close to the gate line 102, of the first electrode 104, and the second protruding part covers the via hole H.

Due to the existence of the via hole H, the part, bearing the via hole H, in the thin film transistor 103 is relatively large, correspondingly, a second protruding part of the via hole H is arranged on a side, close to the gate line 102, of the first electrode 104, thereby effectively realizing electrical connection between the first electrode 104 and the part, bearing the via hole H, in the thin film transistor 103.

Optionally, as shown in FIG. 4 and FIG. 5, in the above detection substrate provided in an embodiment of the present disclosure, a second groove is arranged on a side, close to the second protruding part, of the gate line 102, to ensure that the distance between the first electrode 104 and the gate line 102 along the first direction x is basically equal, thereby reducing crosstalk between the signal of the gate line 102 and the signal of the first electrode 104; moreover, the part not having a groove on the gate line 102 ensures that the resistance of the gate line 102 satisfies requirements, that is, the resistance of the gate line 102 will not be too large due to the setting of the second groove.

Optionally, as shown in FIG. 5, in the above detection substrate provided in an embodiment of the present disclosure, the insulating layer 109 includes a first passivation layer 1091, a second passivation layer 1092 and a third passivation layer 1093 which are arranged in sequence in a laminated manner. The first passivation layer 1091 and the third passivation layer 1093 both include at least one of silicon oxide and silicon oxynitride. The first passivation layer 1091 and the third passivation layer 1093 are formed by adopting silicon oxide and/or silicon oxynitride, thereby effectively avoiding the problem of conduction of the channel region contained in the active layer of an IGZO material caused when the first passivation layer 1091 and the third passivation layer 1093 are manufactured with silicon nitride in the related art.

Optionally, in the above detection substrate provided in an embodiment of the present disclosure, the second passivation layer 1092 is of a resin material, and the thickness of the second passivation layer 1092 ranges from 1 μm to 3 μm, for example, the thickness may be 1 μm, 1.5 μm, 1.8 μm, 2 μm, 2.5 μm and 3 μm, etc. Specifically, the resin material may be polyacrylic resin, polyepoxy acrylic resin, photosensitive polyimide resin, polyester acrylate, polyurethane acrylate resin, phenolic epoxy acrylic resin and other organic insulating materials, which is not defined herein.

The second passivation layer 1092 with a thickness of 1 μm to 3 μm and made of a resin material can effectively prevent external moisture and hydrogen in the subsequent manufacturing process of the photoelectric conversion structure 105 from diffusing to the channel region, thereby improving stability of the thin film transistor 103.

In addition, since the first electrode 104 covers the thin film transistor 103, and a parasitic capacitor is formed between the first electrode 104 and the thin film transistor 103, the second passivation layer 1092 constituted by resin materials is set to increase the distance between the first electrode 104 and the thin film transistor 103, further reduce the parasitic capacitance, and avoid unfavorable influence of the first electrode 104 on the thin film transistor 103.

Optionally, as shown in FIG. 6 to FIG. 10, in the above detection substrate provided in an embodiment of the present disclosure, the orthographic projection of the photoelectric conversion structure 105 on the base substrate 100 at least partially surrounds the orthographic projection of the via hole H on the base substrate 100, to improve fill rate.

Figure 11:
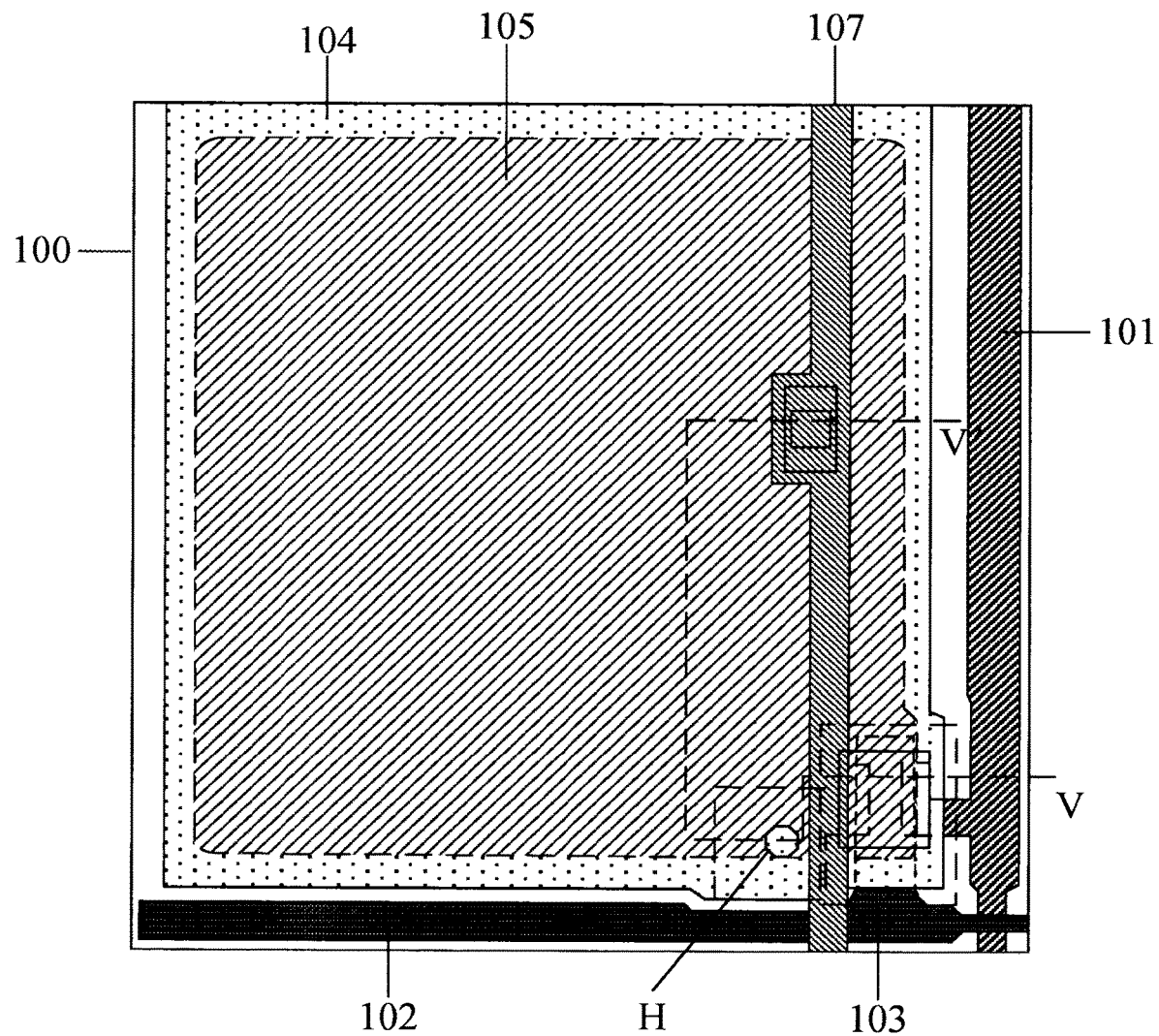
FIG. 11 is a fifth top-view structural schematic diagram of a pixel unit on a detection substrate as shown in FIG. 1.
Figure 12:
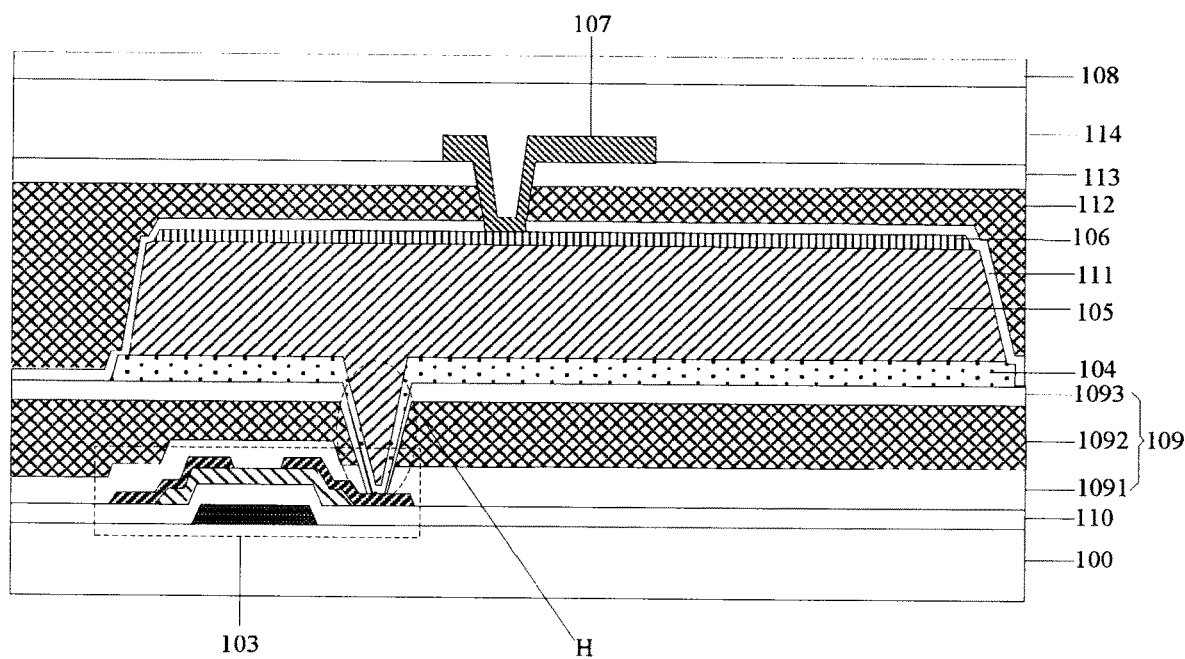
FIG. 12 is a sectional structural schematic diagram along a V-V' line in FIG. 11.

Specifically, in the above detection substrate provided in an embodiment of the present disclosure, the orthographic projection of the photoelectric conversion structure 105 on the base substrate 100 at least partially surrounds the orthographic projection of the via hole H on the base substrate 100, and the test result proves that the fill rate is increased to 67.03% from 59.87% in the related art, such that the overall performance of the flat panel detector is improved; or, as shown in FIG. 11 and FIG. 12, the orthographic projection of the photoelectric conversion structure 105 on the base substrate 100 completely surrounds the orthographic projection of the via hole H on the base substrate 100.

Optionally, in the above detection substrate provided in an embodiment of the present disclosure, as shown in FIG. 11 and FIG. 12, the orthographic projection of the photoelectric conversion structure 105 on the base substrate 100 covers the orthographic projections of the via hole H and the active layer on the base substrate 100. Since the area occupied by the photoelectric conversion structure 105 in a pixel unit P is large, the fill rate is greatly improved.

The bias line 107 penetrates through the detection area AA along the first direction x, the material of the bias line 107 may be a transparent material, such as indium tin oxide (ITO) or indium zinc oxide (IZO), etc., and may also be a metal material, such as copper and silver, etc. When transparent materials are used, the bias line 107 arranged above the photoelectric conversion structure 105 will not block light, thereby effectively improving fill rate. Meanwhile, the bias line 107 and the ITO of the bonding area can also be manufactured through a single composition process, to save the technological process. When metal materials are used, the resistance of the bias line 107 may be effectively reduced, thereby ensuring that the bias voltage within the whole detection area AA keeps consistent. Moreover, to ensure a higher fill rate, the orthographic projection of the bias line 107 of metal materials on the base substrate 100 is not overlapped with the orthographic projection of the active layer on the base substrate 100. Of course, the orthographic projection of the bias line 107 of transparent materials on the base substrate 100 may also be not overlapped with the orthographic projection of the active layer on the base substrate 100, thereby not only ensuring a higher fill rate, but also saving production cost.

Optionally, as shown in FIG. 1 to FIG. 12, the above detection substrate provided in an embodiment of the present disclosure generally further includes: a gate insulating layer 110 arranged between the layer in which the gate of the thin film transistor 103 is located and the active layer, a buffer layer 111, a resin layer 112 and a planarization layer 113 arranged in sequence between the layer in which the second electrode 106 is located and the layer in which the bias line 107 is located, and a fourth passivation layer 114 arranged between the layer in which the bias line 107 is located and the scintillation layer 108.

The gate insulating layer 110 is formed by high dielectric constant materials, dielectric materials, other suitable materials or a combination thereof. The above high dielectric constant materials for example include lead oxide, tantalum pentoxide, zirconium dioxide, aluminum oxide, other suitable materials or a combination thereof. The above dielectric materials for example include silicon nitride, silicon oxynitride, other suitable materials or a combination thereof.

The buffer layer 111 and the fourth passivation layer 114 can be formed through dielectric materials or other suitable materials. For example, the buffer layer 111 and the fourth passivation layer 114 may be formed through silicon oxide, silicon nitride, silicon oxynitride, other suitable materials, or a combination thereof.

A resin layer 112 can be formed through organic insulating materials or other suitable materials. For example, the above organic insulating materials include polyacrylic resin, polyepoxy acrylic resin, photosensitive polyimide resin, polyester acrylate, polyurethane acrylate resin, phenolic epoxy acrylic resin, other suitable materials or a combination thereof.

A planarization layer 113 is used to provide a flat surface for the subsequent process. The planarization layer 113 can be formed through dielectric materials or other suitable materials. For example, the planarization layer 113 can be formed through silicon oxide, silicon nitride, silicon oxynitride, other suitable materials or a combination thereof.

Figure 9:
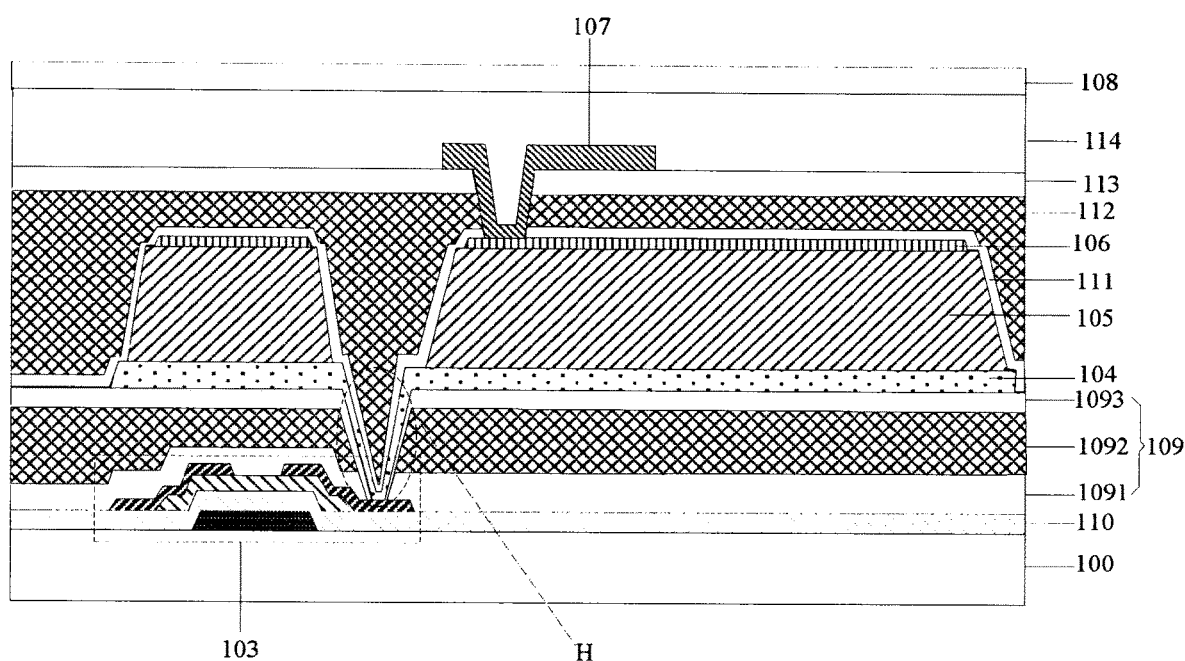
FIG. 9 is a first sectional structural schematic diagram along an IV-IV' line in FIG. 8.
Figure 10:
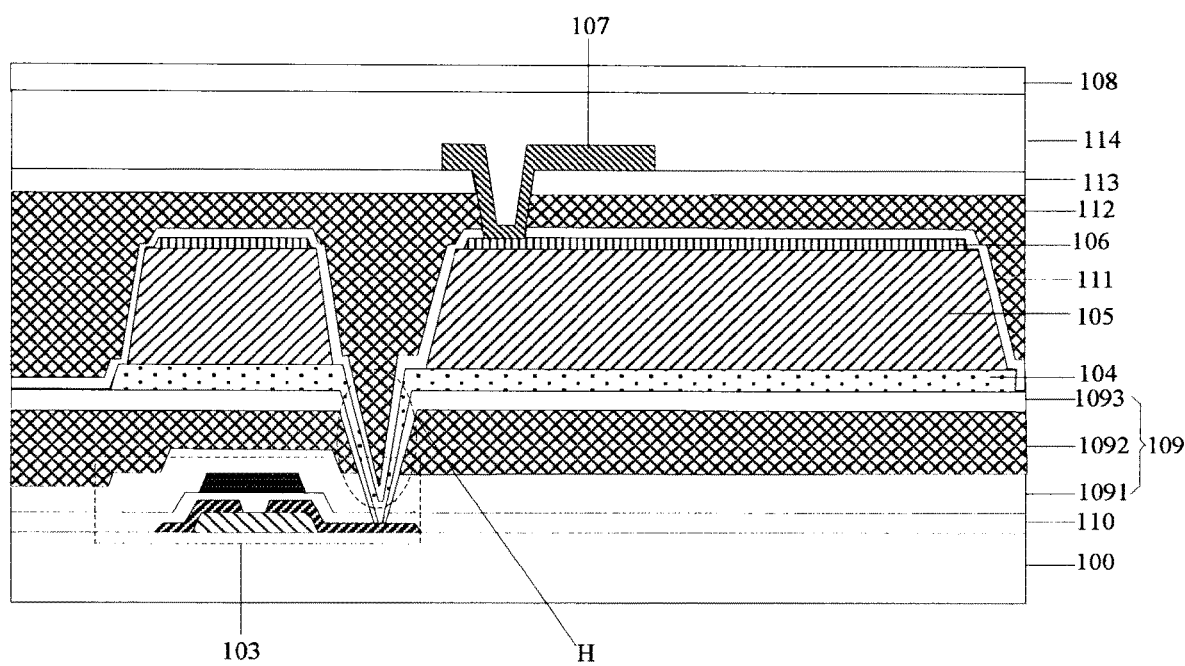
FIG. 10 is a second sectional structural schematic diagram along an IV-IV' line in FIG. 8.

The thin film transistor 103 may be specifically a bottom-gate structure, as shown in FIG. 9, or, may also be a top-gate structure, as shown in FIG. 10, and the gate can protect the active layer from being influenced by hydrogen. The gate metal layer and the source-drain metal layer in the thin film transistor 103 may be formed by molybdenum, aluminum, silver, copper, titanium, platinum, tungsten, tantalum, tantalum nitride, an alloy thereof and a combination thereof or other suitable materials.

To simplify manufacturing process, save manufacturing cost and improve production efficiency, the gate line 102 and the gate of the thin film transistor 103 can be prepared simultaneously through a single composition process. Of course, two composition processes can also be adopted to respectively prepare the gate line 102 and the gate of the thin film transistor 103, which is not defined herein.

In addition, to simplify the manufacturing process, save manufacturing cost and improve production efficiency, the source and the drain of the thin film transistor 103 and the data line 101 can also be prepared simultaneously through a single composition process. Of course, two composition processes can also be adopted to respectively prepare the source and the drain of the thin film transistor 103, and the data line 101, which is not defined herein.

Figure 13:
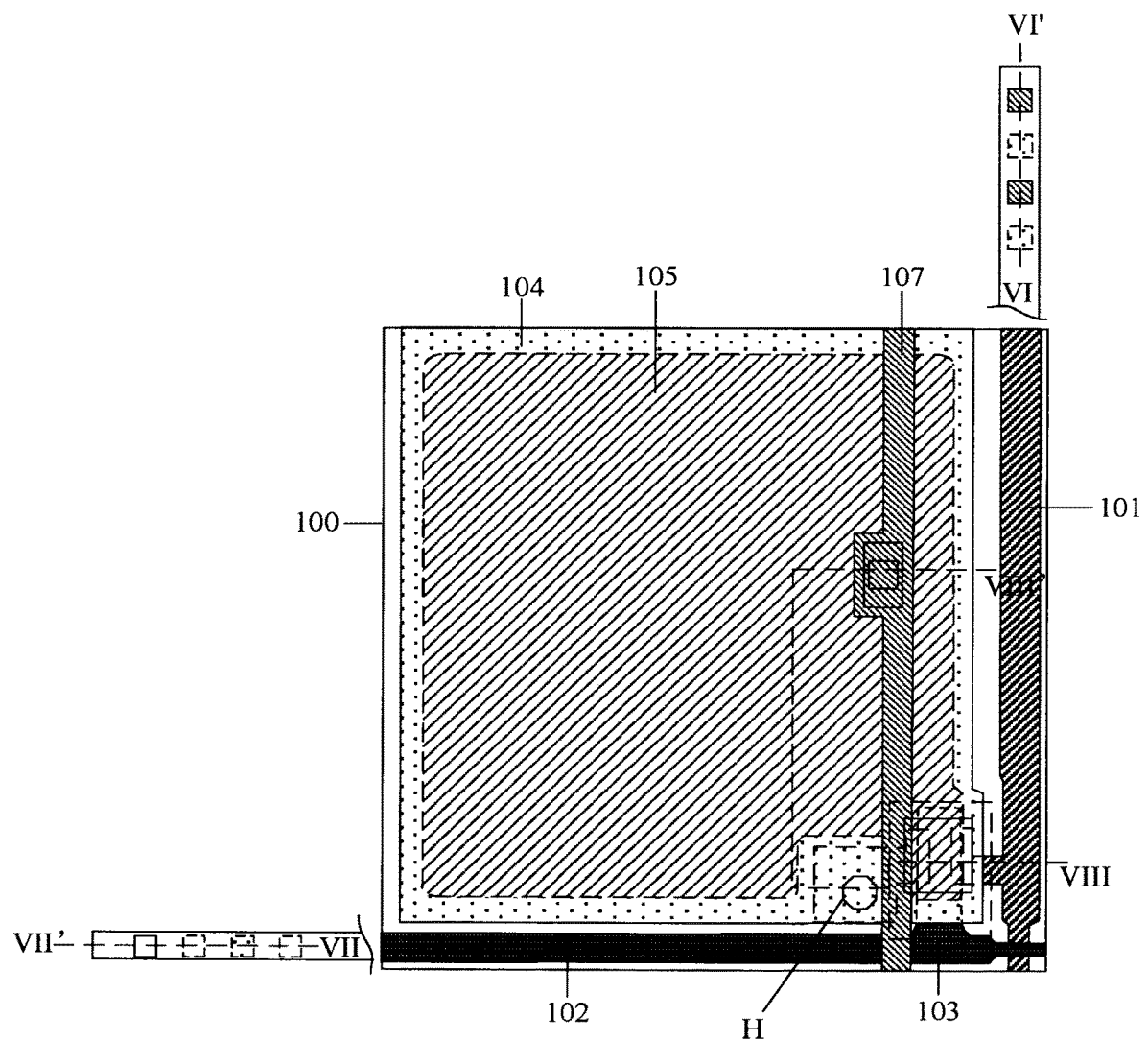
FIG. 13 is another top-view structural diagram of a detection substrate provided in an embodiment of the present disclosure.
Figure 14:
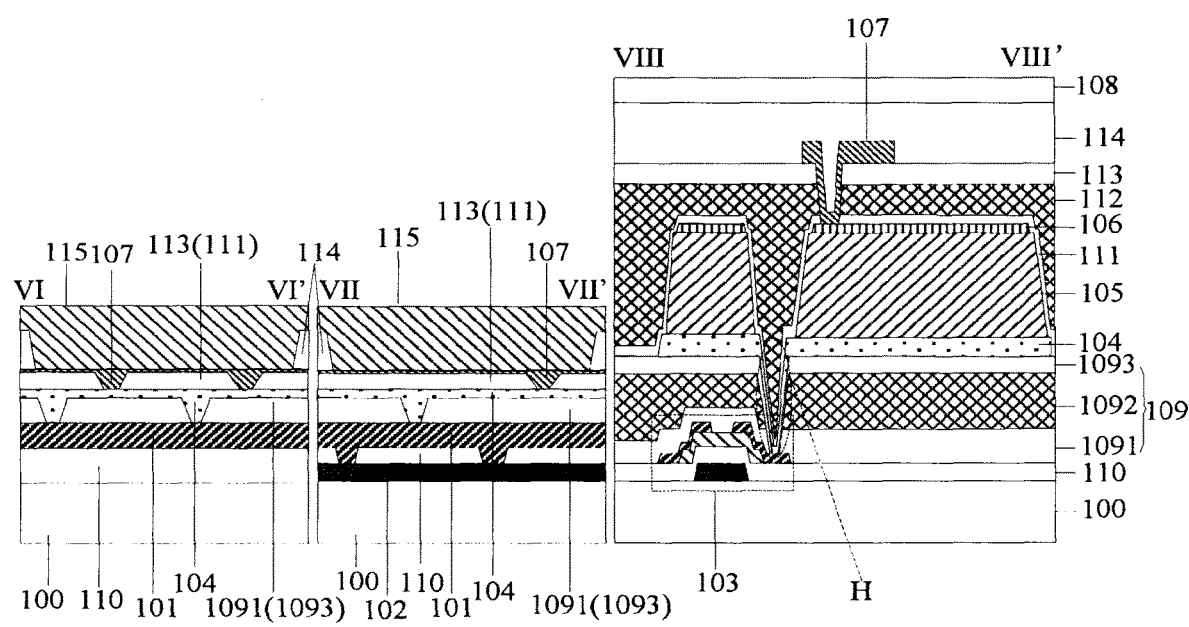
FIG. 14 is a sectional structural schematic diagram along lines VI-VI', VII-VII' and VIII-VIII' in FIG. 13.

Optionally, as shown in FIG. 13 and FIG. 14, the above detection substrate provided in an embodiment of the present disclosure further includes: a transparent lead layer 115 arranged in the bonding area.

The data line 101 extends to the bonding area, and the data line 101 has a corresponding electrically connected first outgoing line in the layer in which the first electrode 104 is located, the layer in which the bias line 107 is located and the transparent lead layer 115 which are above the bonding area. The first outgoing line is configured to provide electrical signals for the data line 101 electrically connected with the first outgoing line. The gate line 102 extends to the bonding area, and the gate line 102 has a corresponding electrically connected second outgoing line in the layer in which the data line 101 is located, the layer in which the first electrode 104 is located, the layer in which the bias line 107 is located and the transparent lead layer 115 which are above the bonding area. The second outgoing line is configured to provide electrical signals for the gate line 102 electrically connected with the second outgoing line. During specific implementation, the above conductive layers are electrically connected through a via hole. The transparent lead layer 115 may be formed by transparent conductive materials of indium tin oxide (ITO) or indium zinc oxide (IZO).

It should be noted that, in the detection substrate shown in FIG. 13 and FIG. 14, the wiring of the bonding area is illustrated with the material of the bias line 107 being a metal material as an example. If the material of the bias line 107 is a transparent material, then the bias line 107 can be set to be in the same layer as the transparent lead layer 115, and a single composition process is adopted to manufacture the patterns of the bias line 107 and the transparent lead layer 115. The wiring of the bonding area is correspondingly changed as follows: the data line 101 has a corresponding electrically connected first outgoing line in the layer in which the first electrode 104 is located and the layer in which the bias line 107 is located (that is, the transparent lead layer 115) which are above the bonding area; the gate line 102 has a corresponding electrically connected second outgoing line in the layer in which the data line 101 is located, the layer in which the first electrode 104 is located, and the layer in which the bias line 107 is located (that is, the transparent lead layer 115) which are above the bonding area.

Aiming at the above detection substrate provided in an embodiment of the present disclosure, an embodiment of the present disclosure provides a preparation method, including the following steps: providing a base substrate; and forming one or more film layer of the thin film transistor, an insulating layer with a via hole, a first electrode, a photoelectric conversion structure, a second electrode and a bias line in sequence on the base substrate, where the first electrode is electrically connected with the thin film transistor through a via hole, and the bias line is electrically connected with the second electrode.

Optionally, in the above method provided in an embodiment of the present disclosure, an insulating layer with a via hole can be manufactured through the following two possible implementation manners.

one of the possible implementation manners can further include: in a first manufacturing facility: forming a first passivation layer; forming a first via hole corresponding to the position of the thin film transistor on the first passivation layer; forming a second passivation layer and a third passivation layer; in a second manufacturing facility: respectively forming a second via hole and a third via hole corresponding to the first via hole on the second passivation layer and the third passivation layer.

Another possible implementation manner can further include: in a first manufacturing facility: forming a first passivation layer and a second passivation layer in sequence; exposing the second passivation layer, to form a second via hole penetrating through the second passivation layer and corresponding to the position of the thin film transistor; forming a first via hole corresponding to the second via hole on the first passivation layer; and forming a third passivation layer on the second passivation layer; in a second manufacturing facility: forming a third via hole corresponding to the second via hole on the third passivation layer.

It should be noted that, in the above preparation method provided in an embodiment of the present disclosure, the composition process involved in forming each layer of structure may not only include part or all of the processes including deposition, photoresist coating, masking of a mask plate, exposure, developing, etching, and photoresist stripping, and can also include other processes, which specifically depends on the graphics required to be composed in the actual manufacturing process, and is not defined herein. For example, a postbaking process can also be included after developing and before etching.

The deposition process may be a chemical vapor deposition method, a plasma enhanced chemical vapor deposition method or a physical vapor deposition method, which is not defined herein; the mask used in the mask process may be a half tone mask, a modified single mask, a single slit mask or a gray tone mask, which is not defined herein; and the etching may be dry etching or wet etching, which is not defined herein.

Figure 8:
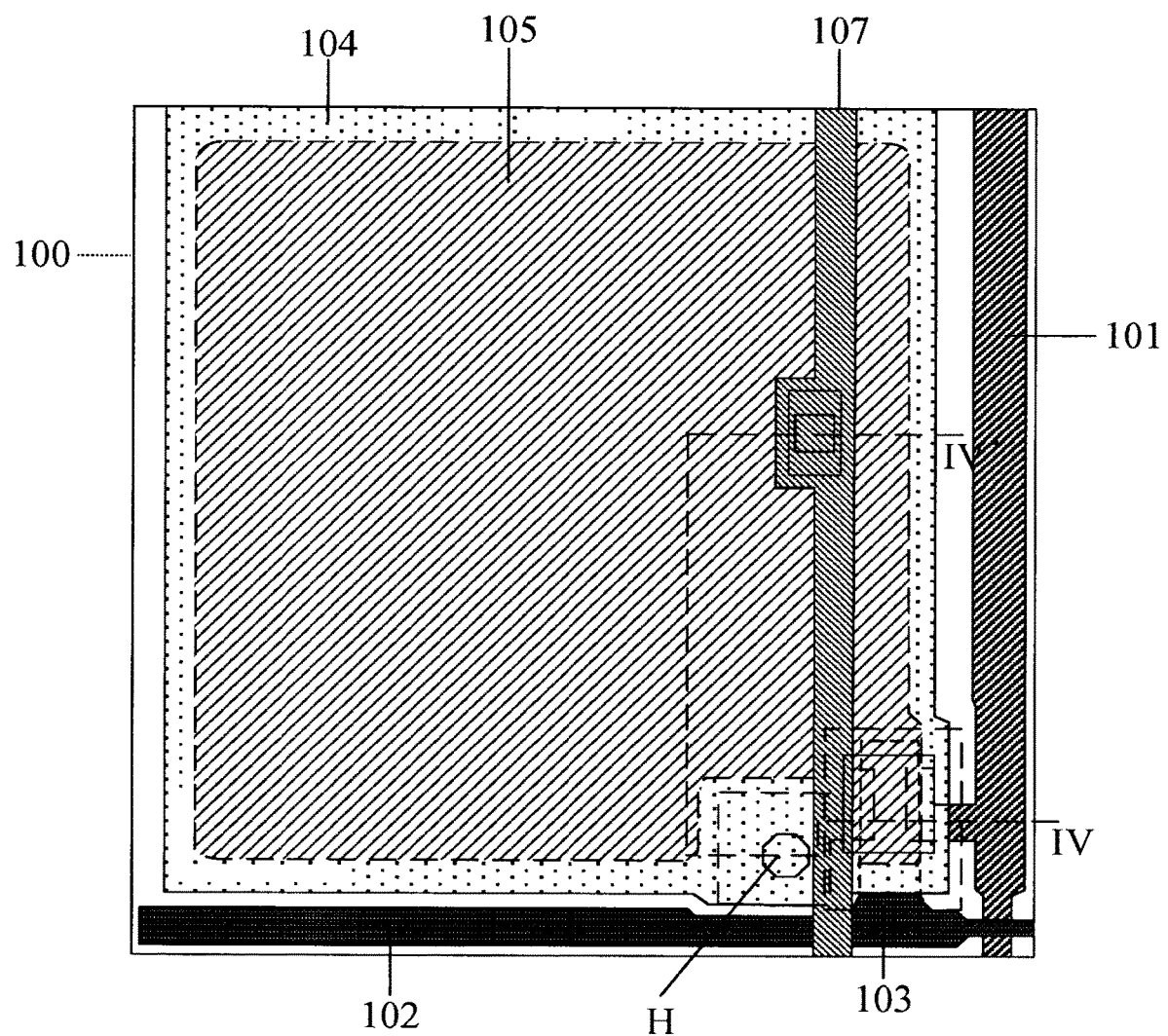
FIG. 8 is a fourth top-view structural schematic diagram of a pixel unit on the detection substrate as shown in FIG. 1.

To better understand the technical solution of the present disclosure, the manufacturing process of the detection substrate shown in FIG. 8 and FIG. 9 are described in detail below.

Figure 15:
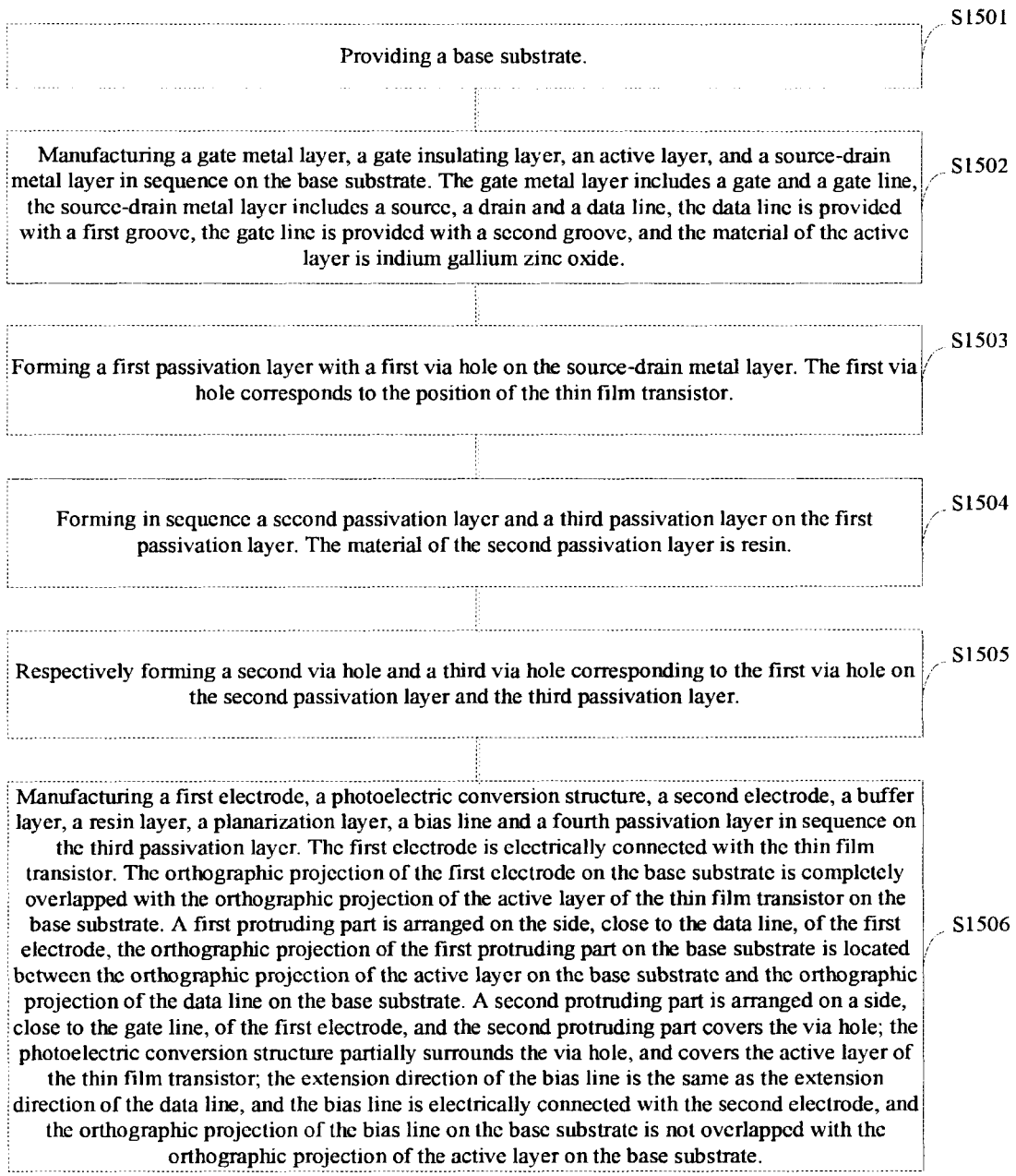
FIG. 15 is a first flow chart of a method for preparing a detection substrate provided in an embodiment of the present disclosure.

The detection substrate with the structure shown in FIG. 8 and FIG. 9 can be manufactured through the following steps by adopting the preparation method shown in FIG. 15.

S1501, providing a base substrate 100.

Figure 16:
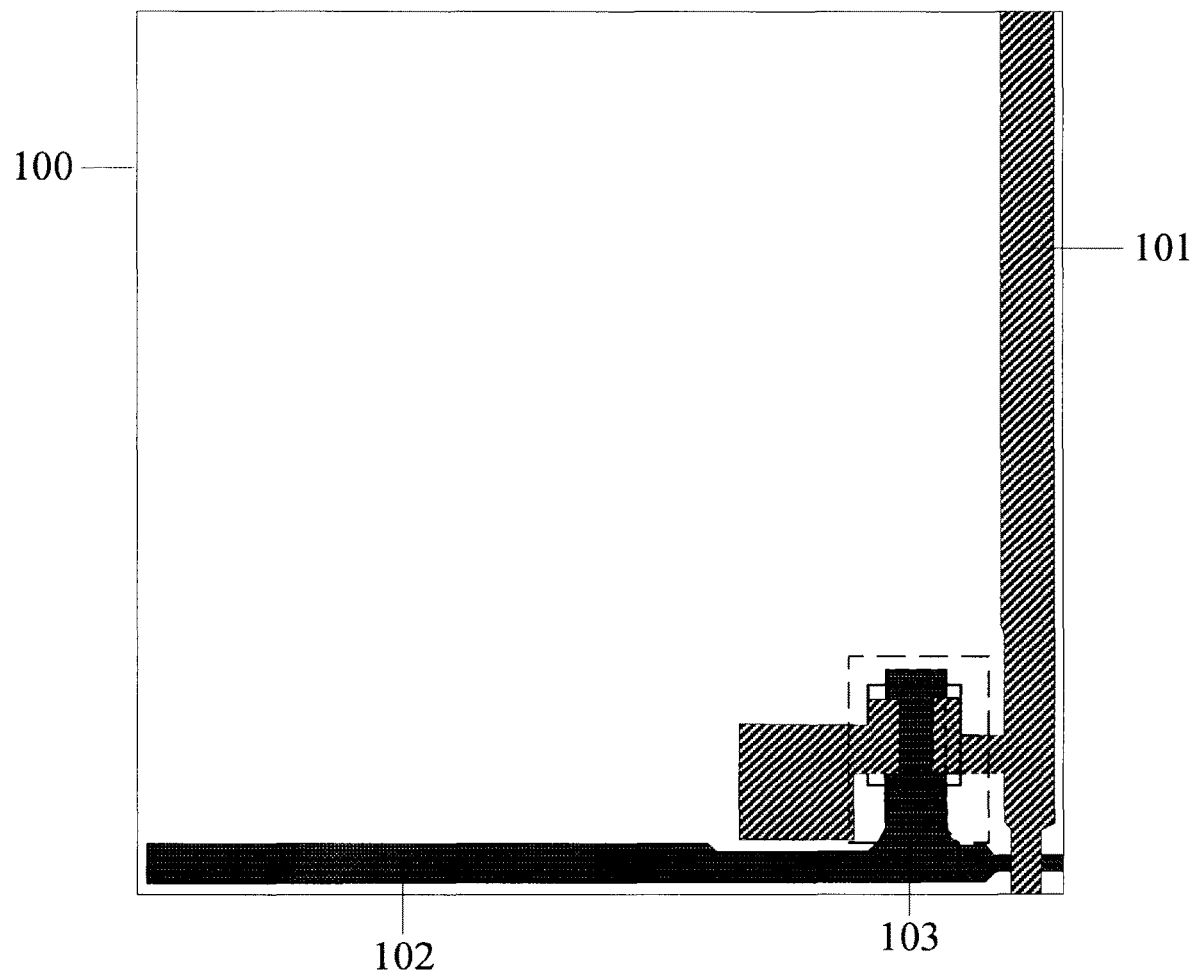
FIG. 16, FIG. 17, FIG. 18, FIG. 19, FIG. 20, FIG. 21, FIG. 22 and FIG. 23 are respectively structural schematic diagrams corresponding to each step in the process of preparing a pixel unit on the detection substrate shown in FIG. 8 and FIG. 9 by adopting the flow chart as shown in FIG. 15.
Figure 17:
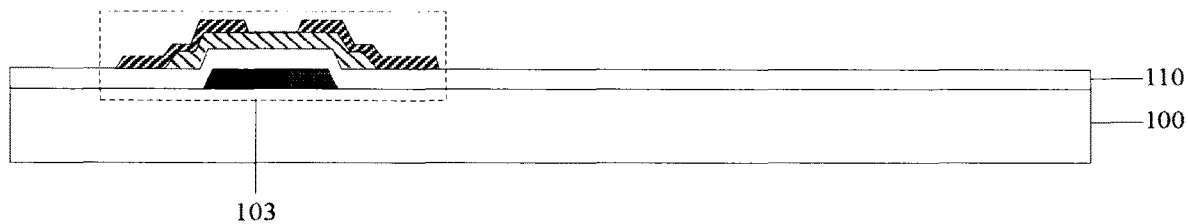

S1502, manufacturing a gate metal layer, a gate insulating layer 110, an active layer, and a source-drain metal layer in sequence on the base substrate 100. The gate metal layer includes a gate and a gate line 102, the source-drain metal layer includes a source, a drain and a data line 101, the data line 101 is provided with a first groove, the gate line 102 is provided with a second groove, and the material of the active layer is indium gallium zinc oxide, as shown in FIG. 16 and FIG. 17.

Figure 18:
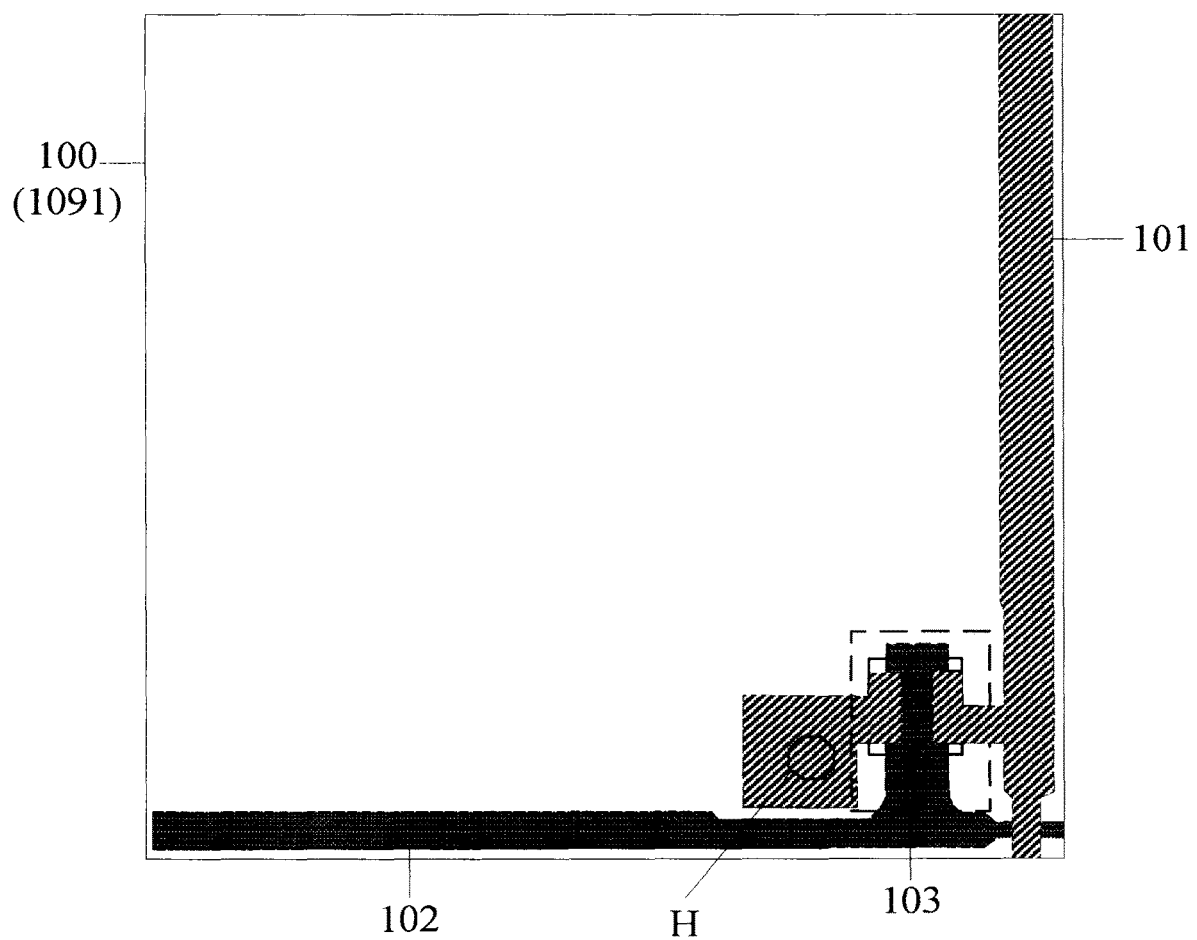
Figure 19:
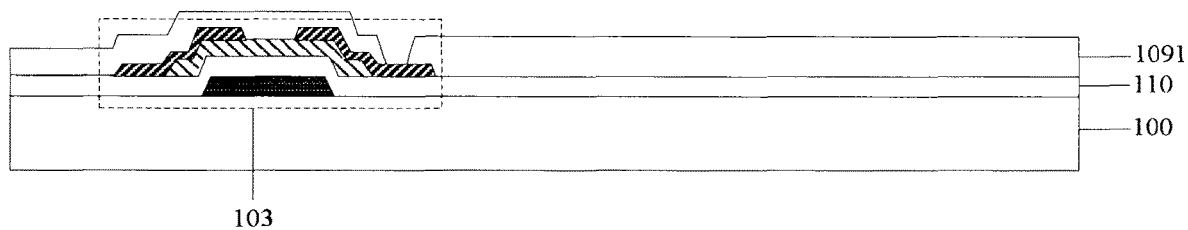

S1503, forming a first passivation layer 1091 with a first via hole on the source-drain metal layer. The first via hole corresponds to the position of the thin film transistor, as shown in FIG. 18 and FIG. 19.

Figure 20:
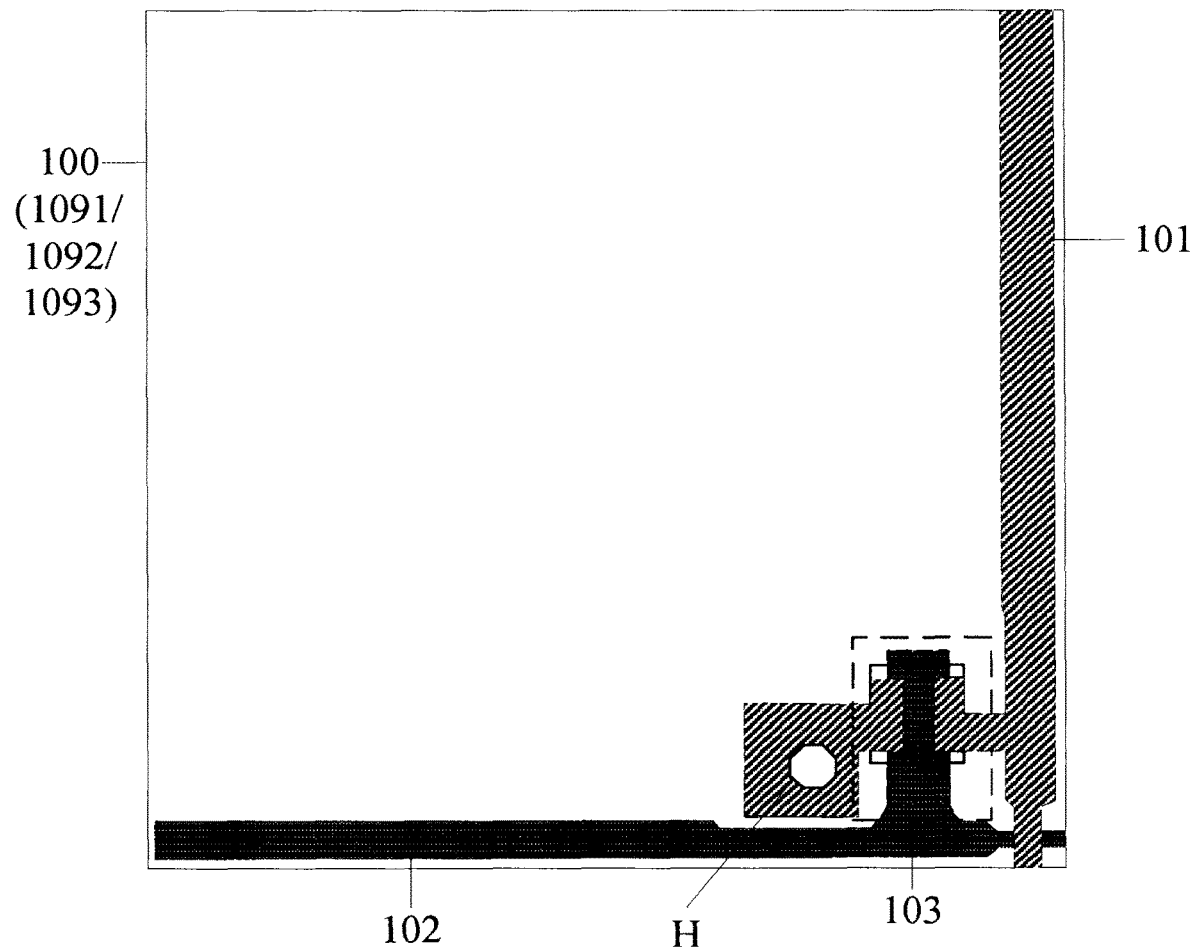
Figure 21:
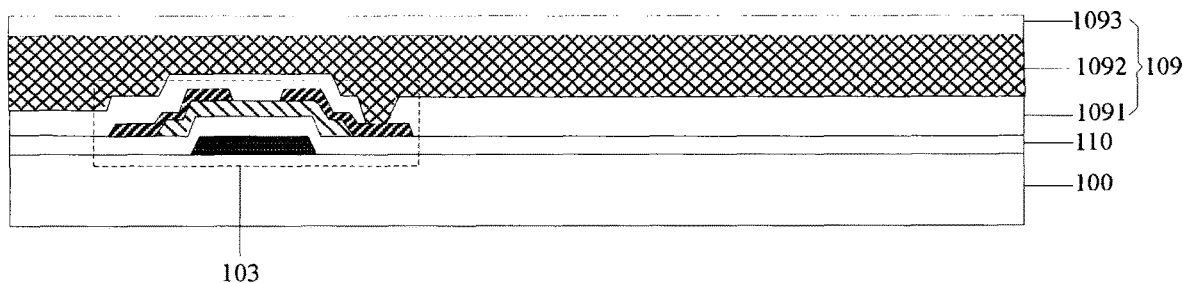

S1504, forming in sequence a second passivation layer 1092 and a third passivation layer 1093 on the first passivation layer 1091, as shown in FIG. 20 and FIG. 21.

Figure 22:
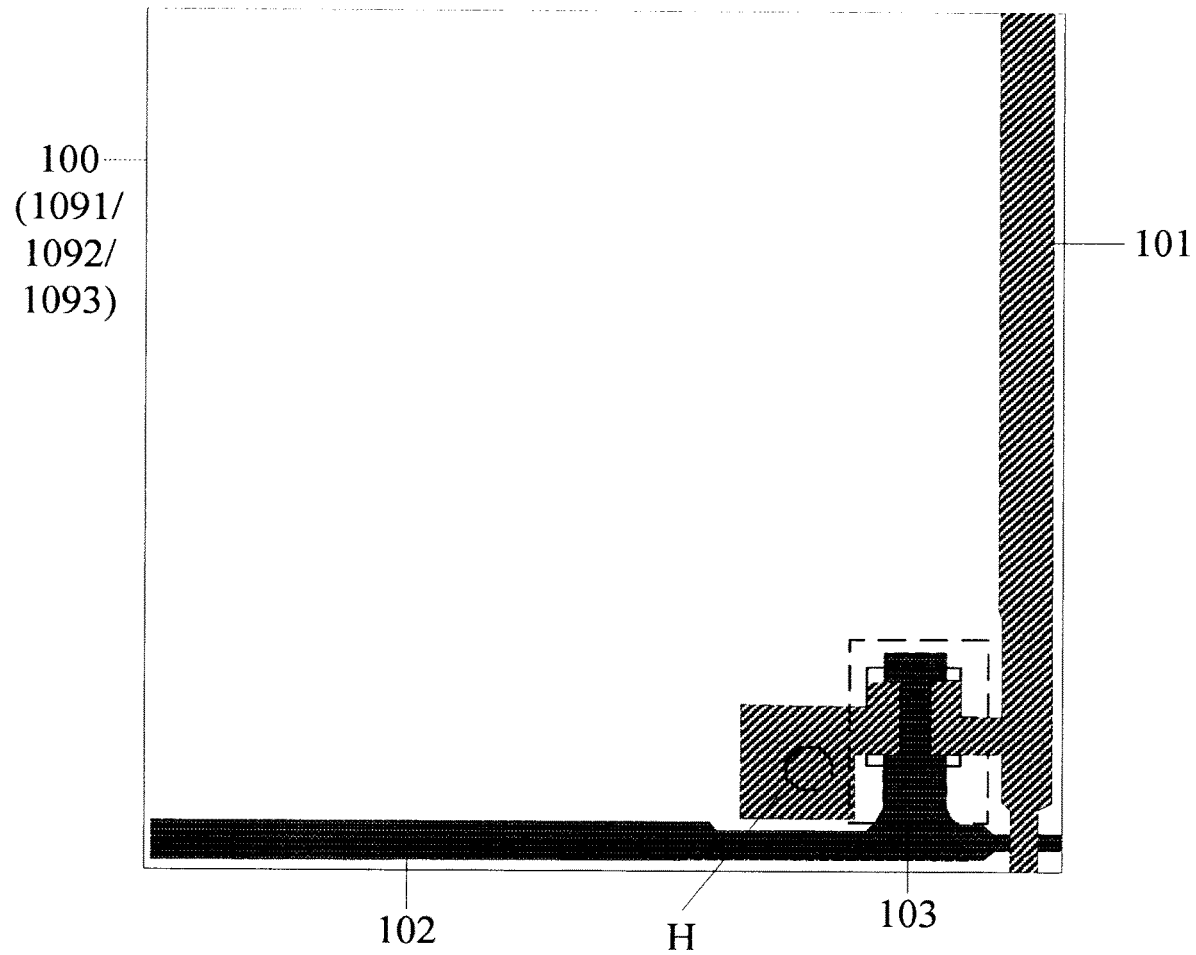
Figure 23:
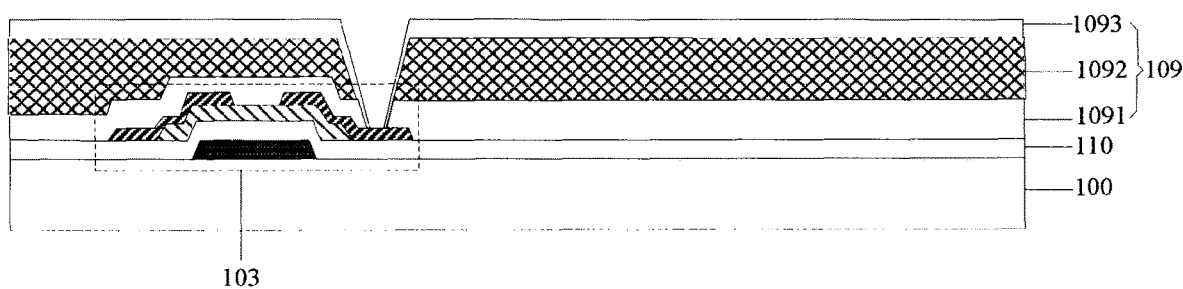

S1505, respectively forming a second via hole and a third via hole corresponding to the first via hole on the second passivation layer 1092 and the third passivation layer 1093, as shown in FIG. 22 and FIG. 23.

S1506, manufacturing a first electrode 104, a photoelectric conversion structure 105, a second electrode 106, a buffer layer 111, a resin layer 112, a planarization layer 113, a bias line 107 and a fourth passivation layer 114 in sequence on the third passivation layer 1093.

The first electrode 104 is electrically connected with the thin film transistor 103. The orthographic projection of the first electrode 104 on the base substrate 100 is completely overlapped with the orthographic projection of the active layer of the thin film transistor 103 on the base substrate 100.

A first protruding part is arranged on the side, close to the data line 101, of the first electrode 104, the orthographic projection of the first protruding part on the base substrate 100 is located between the orthographic projection of the active layer on the base substrate 100 and the orthographic projection of the data line 101 on the base substrate 100.

A second protruding part is arranged on a side, close to the gate line 102, of the first electrode 104, and the second protruding part covers the via hole; the photoelectric conversion structure 105 partially surrounds the via hole, and covers the active layer of the thin film transistor 103; the extension direction of the bias line 107 is the same as the extension direction of the data line 101, and the bias line 107 is electrically connected with the second electrode 106, and the orthographic projection of the bias line 107 on the base substrate 100 is not overlapped with the orthographic projection of the active layer on the base substrate 100.

Till then, the manufacturing of the detection substrate shown in FIG. 8 and FIG. 9 is finished.

It should be noted that, in the preparation method shown in FIG. 15, S1501 to S1504 are implemented in the first manufacturing facility, and S1505 to S1506 are implemented in the second manufacturing facility.

Figure 24:
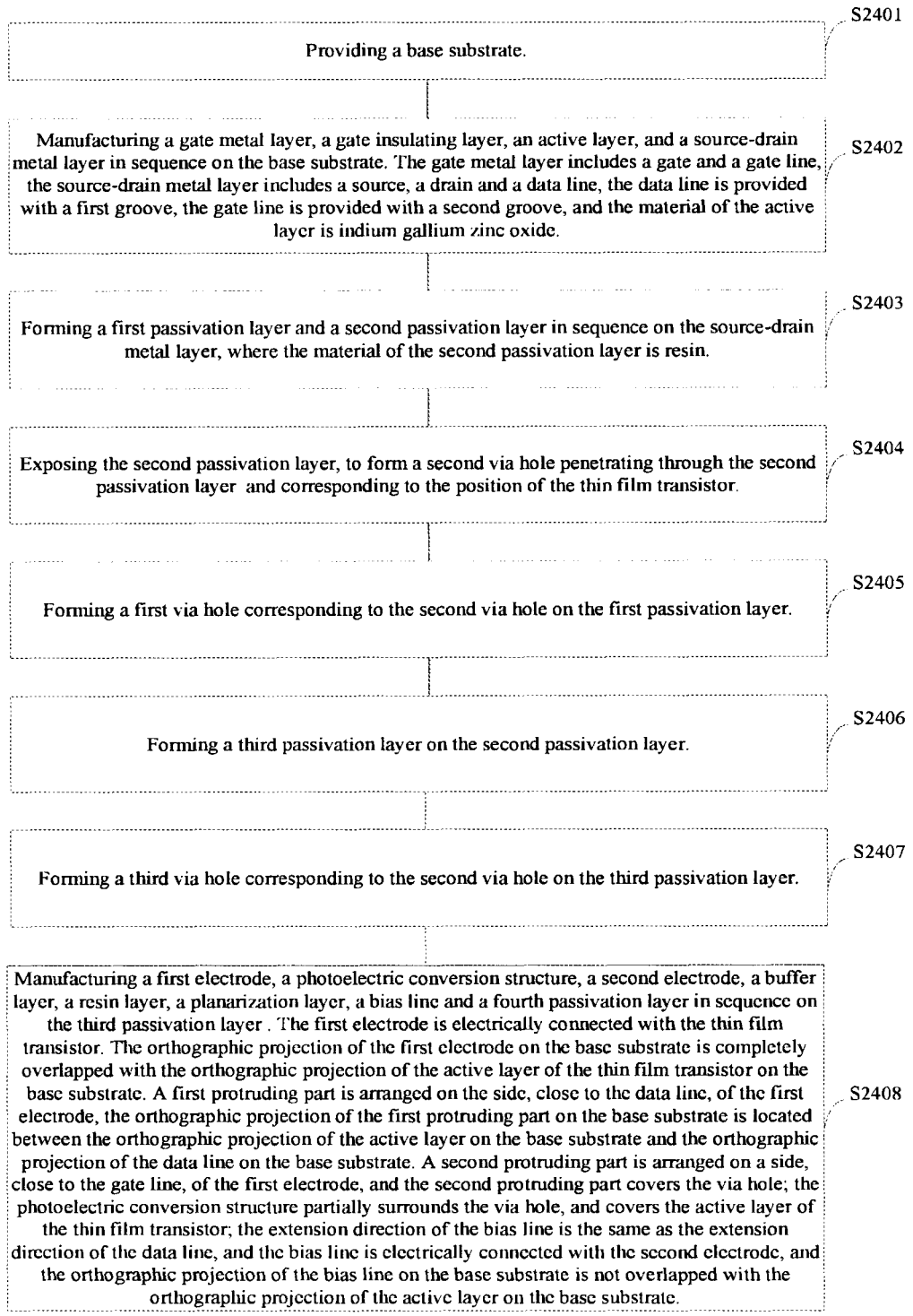
FIG. 24 is a second flow chart of a method for preparing a detection substrate provided in an embodiment of the present disclosure.

The detection substrate with the structure shown in FIG. 8 and FIG. 9 can be manufactured specifically through the following steps by adopting the preparation method shown in FIG. 24.

S2401, providing a base substrate 100.

S2402, manufacturing a gate metal layer, a gate insulating layer 110, an active layer, and a source-drain metal layer in sequence on the base substrate 100.

The gate metal layer includes a gate and a gate line 102, the source-drain metal layer includes a source, a drain and a data line 101, the data line 101 is provided with a first groove, the gate line 102 is provided with a second groove, and the material of the active layer is indium gallium zinc oxide, as shown in FIG. 16 and FIG. 17.

Figure 25:
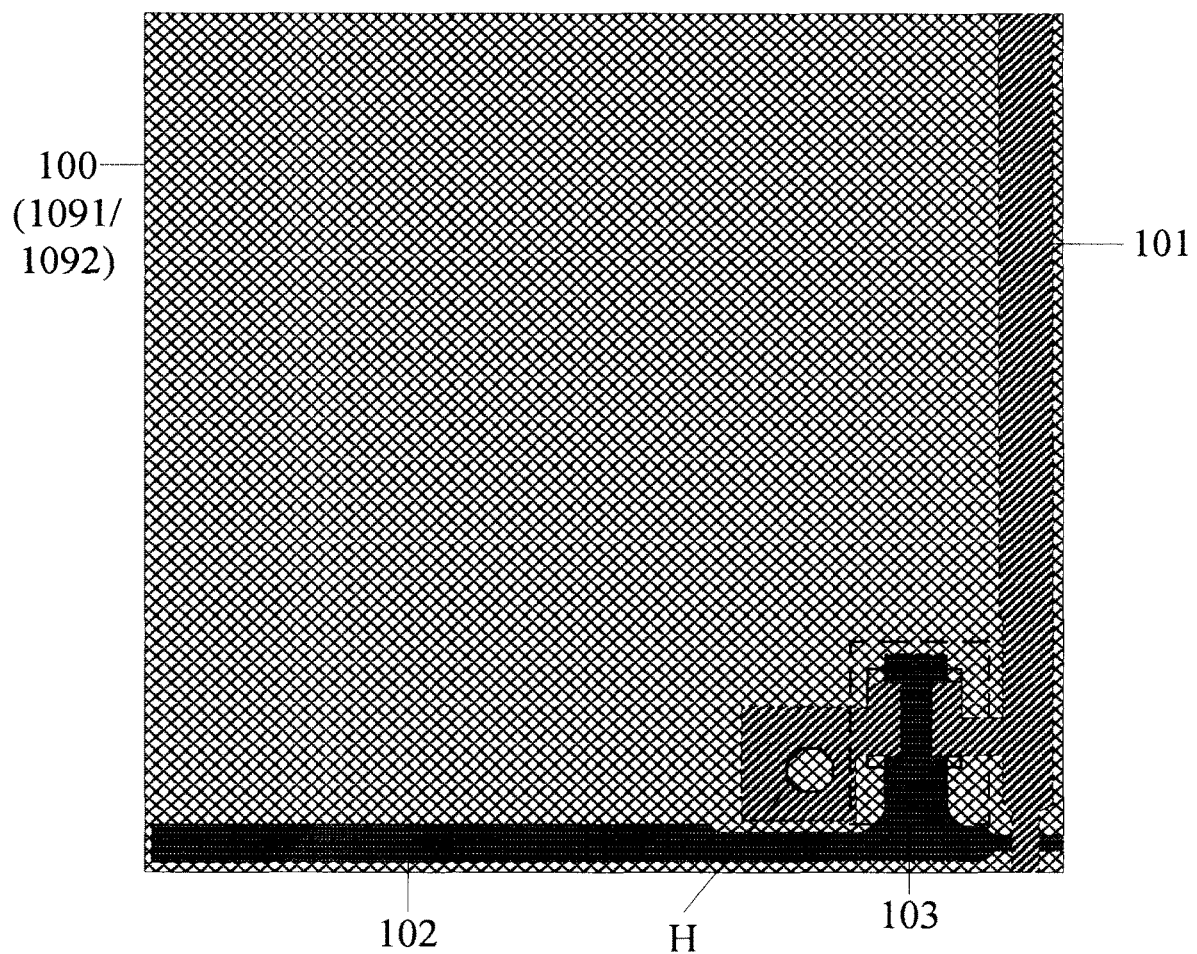
FIG. 25, FIG. 26, FIG. 27, FIG. 28, FIG. 29, FIG. 30 and FIG. 31 are respectively structural schematic diagrams corresponding to each step in the process of preparing a pixel unit on the detection substrate shown in FIG. 8 and FIG. 9 by adopting the flow chart as shown in FIG. 24.
Figure 26:
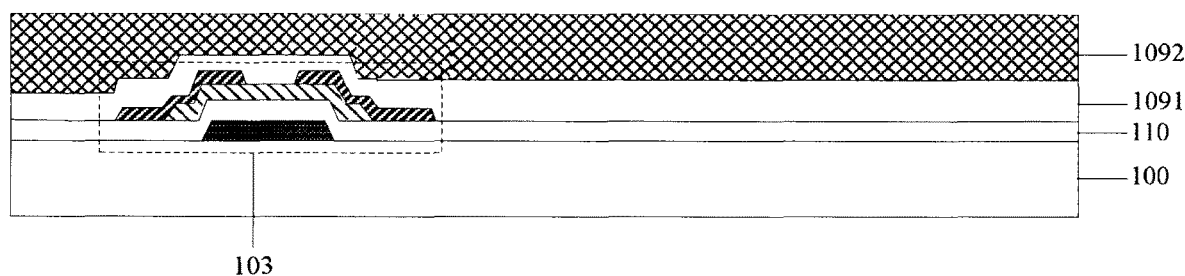

S2403, forming a first passivation layer 1091 and a second passivation layer 1092 in sequence on the source-drain metal layer, where the material of the second passivation layer is resin, as shown in FIG. 25 and FIG. 26.

Figure 27:
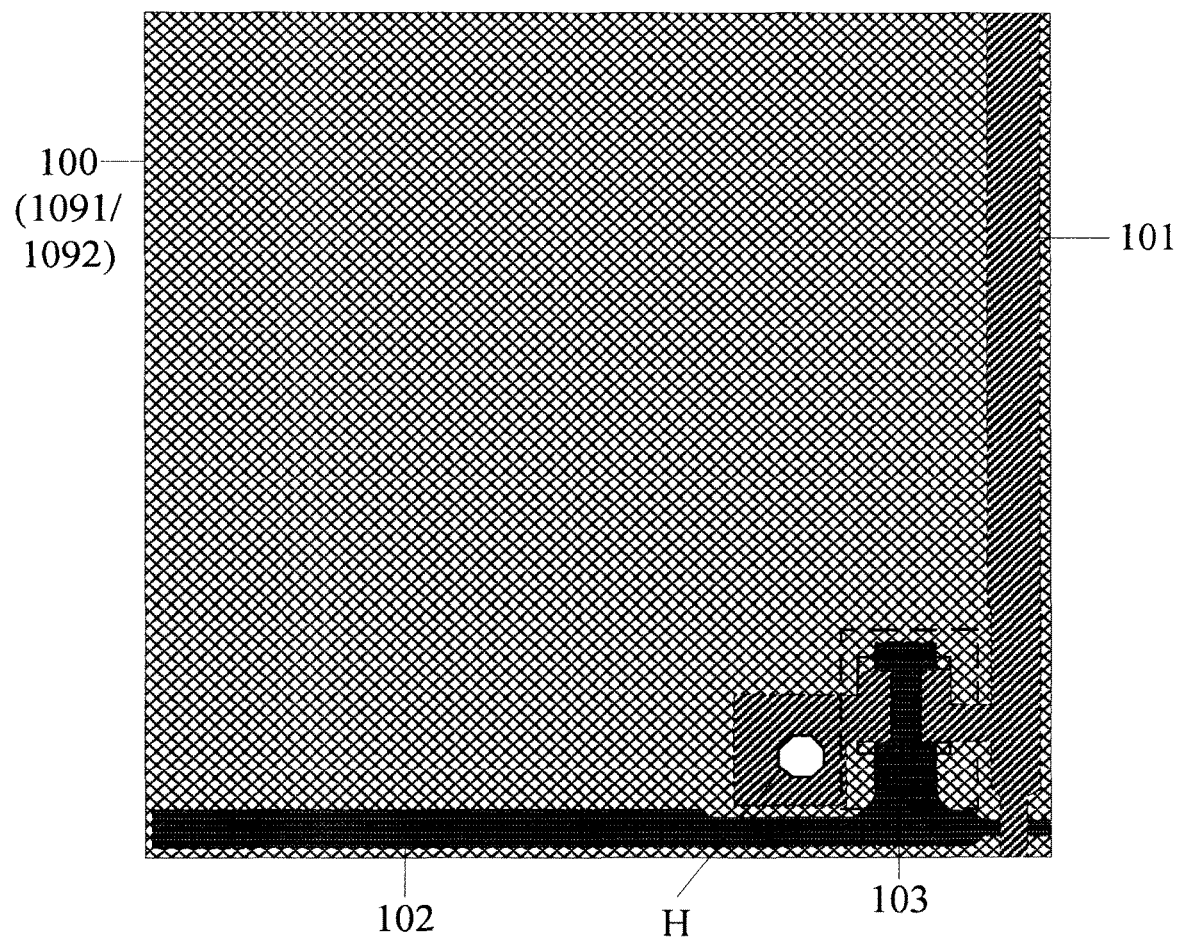
Figure 28:
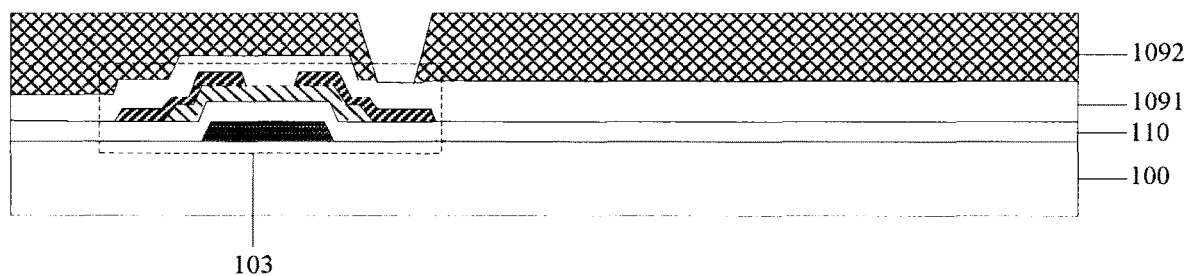

S2404, exposing the second passivation layer 1092, to form a second via hole penetrating through the second passivation layer 1092 and corresponding to the position of the thin film transistor 103, as shown in FIG. 27 and FIG. 28.

Figure 29:
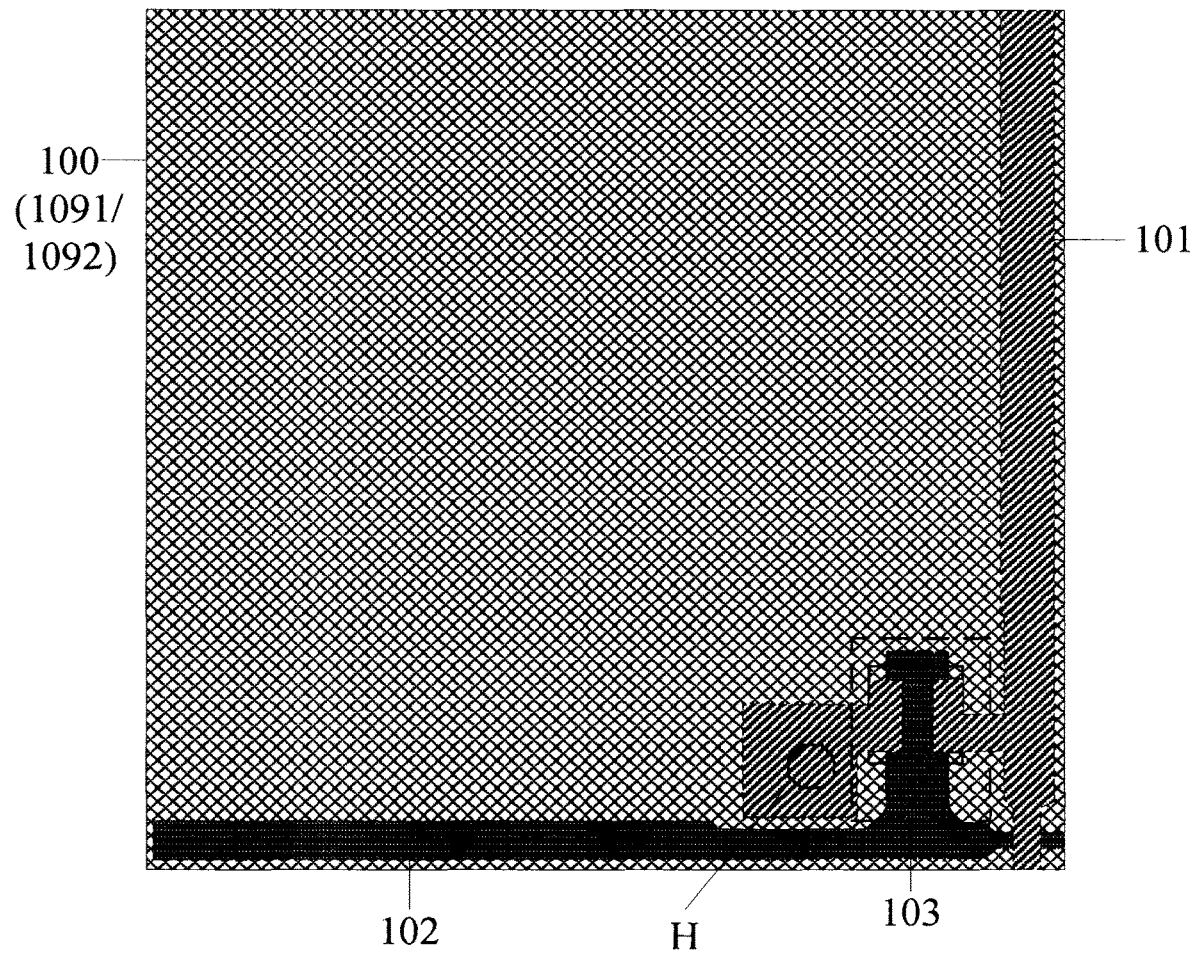
Figure 30:
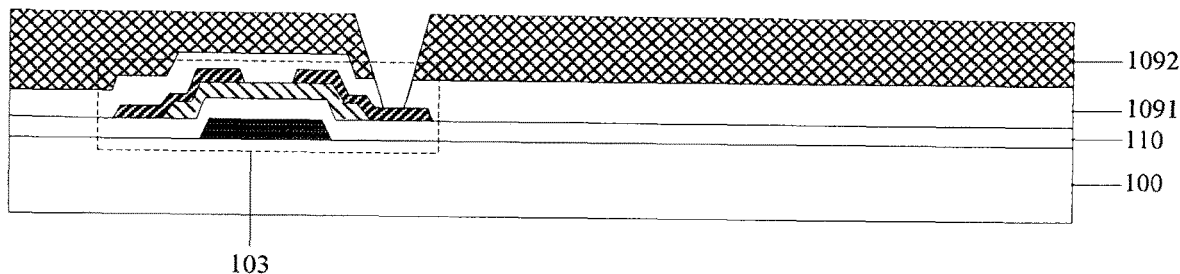

S2405, forming a first via hole corresponding to the second via hole on the first passivation layer 1091, as shown in FIG. 29 and FIG. 30.

Figure 31:
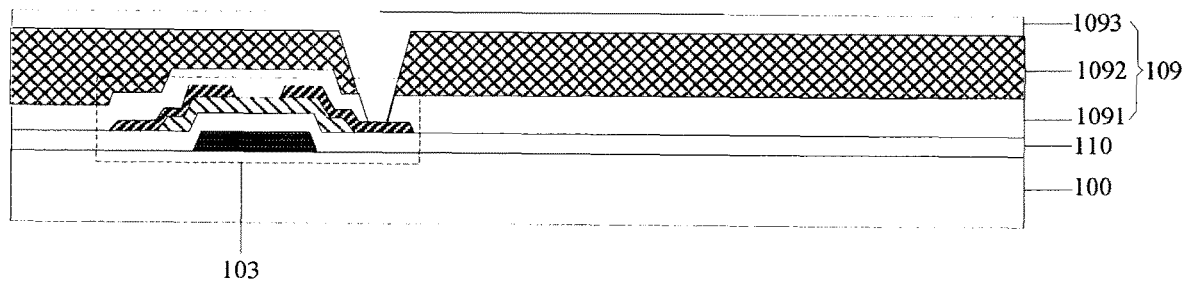

S2406, forming a third passivation layer 1093 on the second passivation layer 1092, as shown in FIG. 20 and FIG. 31.

S2407, forming a third via hole corresponding to the second via hole on the third passivation layer 1093, as shown in FIG. 22 and FIG. 23.

S2408, manufacturing a first electrode 104, a photoelectric conversion structure 105, a second electrode 106, a buffer layer 111, a resin layer 112, a planarization layer 113, a bias line 107 and a fourth passivation layer 114 in sequence on the third passivation layer 1093.

The first electrode 104 is electrically connected with the thin film transistor 103. The orthographic projection of the first electrode 104 on the base substrate 100 is completely overlapped with the orthographic projection of the active layer of the thin film transistor 103 on the base substrate 100.

A first protruding part is arranged on the side, close to the data line 101, of the first electrode 104, the orthographic projection of the first protruding part on the base substrate 100 is located between the orthographic projection of the active layer on the base substrate 100 and the orthographic projection of the data line 101 on the base substrate 100.

A second protruding part is arranged on a side, close to the gate line 102, of the first electrode 104, and the second protruding part covers the via hole; the photoelectric conversion structure 105 partially surrounds the via hole, and covers the active layer of the thin film transistor 103; the extension direction of the bias line 107 is the same as the extension direction of the data line 101, and the bias line 107 is electrically connected with the second electrode 106, and the orthographic projection of the bias line 107 on the base substrate 100 is not overlapped with the orthographic projection of the active layer on the base substrate 100.

Till then, the manufacturing of the detection substrate shown in FIG. 8 and FIG. 9 is finished.

It should be noted that, in the manufacturing method shown in FIG. 24, S2401 to S2406 are implemented in the first manufacturing facility, and S2407 to S2408 are implemented in the second manufacturing facility.

At this point of the manufacturing process, after all the manufacturing steps in the first manufacturing facility are finished, part of the formed detection substrate is conveyed to the second manufacturing facility. The second manufacturing facility can be a different part of the first manufacturing facility, or can be the manufacturing facility far away from the first manufacturing facility physically. Moreover, the first manufacturing facility and the second manufacturing facility can be located on different production lines, and can also be different manufacturing facilities on the same production line.

Optionally, an embodiment of the present disclosure further provides a flat panel detector. Since the principle based on which the flat panel detector solves problems is similar to the principle based on which the above detection substrate solves problems, therefore, for the implementation of the flat panel detector provided in an embodiment of the present disclosure, please refer to the implementation of the above detection substrate provided in an embodiment of the present disclosure, and the repeated parts will not be repeated redundantly herein.

In the detection substrate, the preparation method thereof and the flat panel detector provided in embodiments of the present disclosure, the detection substrate includes: a base substrate; a data line extending along a first direction and a gate line extending along a second direction; a thin film transistor arranged on the base substrate; a first electrode, a photoelectric conversion structure and a second electrode arranged in sequence in a laminated manner and electrically connected with each other, wherein the first electrode is electrically connected with the thin film transistor, and an orthographic projection of the first electrode on the base substrate at least partially overlaps with an orthographic projection of an active layer of the thin film transistor on the base substrate; a first protruding part is arranged on the side, close to the data line, of the first electrode, and an orthographic projection of the first protruding part on the base substrate is located between the orthographic projection of the active layer on the base substrate and the orthographic projection of the data line on the base substrate; and a bias line electrically connected with the second electrode. When the orthographic projection of the first electrode on the base substrate is set to be at least partially overlapped with the orthographic projection of the active layer of the thin film transistor on the base substrate, and a first protruding part is arranged on a side, close to the data line, of the first electrode, the orthographic projection of the first protruding part on the base substrate is located between the orthographic projection of the active layer on the base substrate and the orthographic projection of the data line on the base substrate, thereby preventing hydrogen from diffusing to the active layer in the subsequent process of manufacturing the photoelectric conversion structure, effectively improving the stability of the thin film transistor, and improving the performance of the flat panel detector.

Evidently those skilled in the art can make various modifications and variations to the embodiments of the present disclosure without departing from the spirit and scope of the embodiments of the present disclosure. Thus the present disclosure is also intended to encompass these modifications and variations thereto so long as the modifications and variations come into the scope of the claims appended to the present disclosure and their equivalents.

What is claimed is:

1. A detection substrate, comprising:
   a base substrate;
   a plurality of data lines extending along a first direction;
   a plurality of gate lines extending along a second direction;
   a plurality of thin film transistors arranged on the base substrate;
   a plurality of first electrodes, a plurality of photoelectric conversion structures and a plurality of second electrodes arranged in sequence in a laminated manner and electrically connected with each other;
   a plurality of bias lines electrically connected with the plurality of second electrodes; and
   an insulating layer arranged between a corresponding thin film transistor and each first electrode;
   wherein the each first electrode is electrically connected with the corresponding thin film transistor, and an orthographic projection of the each first electrode on the base substrate at least partially overlaps with an orthographic projection of an active layer of the corresponding thin film transistor on the base substrate;

the each first electrode is electrically connected with the corresponding thin film transistor through a via hole on the insulating layer; and the each first electrode comprises a protruding part arranged on a side, close to a corresponding gate line, of the each first electrode.

2. The detection substrate of claim 1, wherein each gate line comprises a groove arranged on a side, close to the protruding part, of the each gate line, and a distance between the each first electrode and the corresponding gate line along the first direction is basically equal.

3. The detection substrate of claim 1, wherein the insulating layer comprises a first passivation layer, a second passivation layer and a third passivation layer which are arranged in sequence in the laminated manner;
wherein the first passivation layer comprises at least one of silicon oxide and silicon oxynitride; and
the third passivation layer comprises at least one of silicon oxide and silicon oxynitride.

4. The detection substrate of claim 3, wherein the second passivation layer is of a resin material, and a thickness of the second passivation layer ranges from 1 μm to 3 μm.

5. The detection substrate of claim 3, wherein an orthographic projection of the photoelectric conversion structure on the base substrate at least partially surrounds an orthographic projection of the via hole on the base substrate.

6. The detection substrate of claim 3, wherein an orthographic projection of the photoelectric conversion structure on the base substrate covers an orthographic projection of the via hole on the base substrate and the orthographic projection of the active layer on the base substrate.

7. The detection substrate of claim 1, wherein the first electrode at least partially covers the via hole.

8. The detection substrate of claim 1, wherein a material of the active layer is metal oxide.

9. The detection substrate of claim 1, further comprising a transparent lead layer arranged in a bonding area; wherein
the data line extends to the bonding area, and the data line has a corresponding electrically connected first outgoing line in a layer in which the first electrode is located, a layer in which the bias line is located and the transparent lead layer which are above the bonding area.

10. The detection substrate of claim 9, wherein the gate line extends to the bonding area, and the gate line has a corresponding electrically connected second outgoing line in a layer in which the data line is located, the layer in which the first electrode is located, the layer in which the bias line is located and the transparent lead layer which are above the bonding area.

11. A detection substrate, comprising:
a base substrate;
a plurality of data lines extending along a first direction;
a plurality of gate lines extending along a second direction;
a plurality of thin film transistors arranged on the base substrate;
a plurality of first electrodes, a plurality of photoelectric conversion structures and a plurality of second electrodes arranged in sequence in a laminated manner and electrically connected with each other;
a plurality of bias lines electrically connected with the plurality of second electrodes; and
an insulating layer arranged between a corresponding thin film transistor and each first electrode;
wherein the each first electrode is electrically connected with the corresponding thin film transistor, and an orthographic projection of the each first electrode on the base substrate at least partially overlaps with an orthographic projection of an active layer of the corresponding thin film transistor on the base substrate;
the each first electrode comprises a first protruding part arranged on a side, close to a corresponding data line, of the each first electrode, and each data line comprises a first groove arranged on a side, close to the first protruding part, of the each data line; and
the each first electrode further comprises a second protruding part arranged on a side, close to a corresponding gate line, of the each first electrode, and each gate line comprises a second groove arranged on a side, close to the second protruding part, of the each gate line.

12. The detection substrate of claim 11, wherein:
a distance between the each first electrode and the corresponding data line along the second direction is basically equal; and
a distance between the each first electrode and the corresponding gate line along the first direction is basically equal.

13. The detection substrate of claim 11, wherein a material of the active layer is metal oxide.

14. The detection substrate of claim 11, further comprising a transparent lead layer arranged in a bonding area; wherein
the data line extends to the bonding area, and the data line has a corresponding electrically connected first outgoing line in a layer in which the first electrode is located, a layer in which the bias line is located and the transparent lead layer which are above the bonding area.

15. The detection substrate of claim 14, wherein the gate line extends to the bonding area, and the gate line has a corresponding electrically connected second outgoing line in a layer in which the data line is located, the layer in which the first electrode is located, the layer in which the bias line is located and the transparent lead layer which are above the bonding area.

16. A detection substrate, comprising:
a base substrate;
a plurality of data lines extending along a first direction;
a plurality of gate lines extending along a second direction;
a plurality of thin film transistors arranged on the base substrate;
a plurality of first electrodes, a plurality of photoelectric conversion structures and a plurality of second electrodes arranged in sequence in a laminated manner and electrically connected with each other;
a plurality of bias lines electrically connected with the plurality of second electrodes; and
an insulating layer arranged between a corresponding thin film transistor and each first electrode;
wherein each first electrode is electrically connected with a corresponding thin film transistor, and an orthographic projection of the each first electrode on the base substrate at least partially overlaps with an orthographic projection of an active layer of the corresponding thin film transistor on the base substrate;
the insulating layer comprises a first passivation layer, a second passivation layer and a third passivation layer which are arranged in sequence in the laminated manner.

17. The detection substrate of claim 16, wherein
the first passivation layer comprises at least one of silicon oxide and silicon oxynitride;
the third passivation layer comprises at least one of silicon oxide and silicon oxynitride; and
the second passivation layer is of a resin material, and a thickness of the second passivation layer ranges from 1 µm to 3 µm.

18. The detection substrate of claim 16, wherein an orthographic projection of the photoelectric conversion structure on the base substrate at least partially surrounds an orthographic projection of the via hole on the base substrate.

19. The detection substrate of claim 16, wherein an orthographic projection of the photoelectric conversion structure on the base substrate covers an orthographic projection of the via hole on the base substrate and the orthographic projection of the active layer on the base substrate.

20. The detection substrate of claim 19, wherein an orthographic projection of the bias line on the base substrate is not overlapped with the orthographic projection of the active layer on the base substrate.

\* \* \* \* \*